United States Patent
Kato

(10) Patent No.: US 7,956,414 B2
(45) Date of Patent: Jun. 7, 2011

(54) SEMICONDUCTOR SUBSTRATE, SEMICONDUCTOR DEVICE, METHOD FOR MANUFACTURING SEMICONDUCTOR SUBSTRATE, AND METHOD FOR MANUFACTURING SEMICONDUCTOR DEVICE

(75) Inventor: Juri Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 76 days.

(21) Appl. No.: 12/075,073

(22) Filed: Mar. 6, 2008

(65) Prior Publication Data

US 2008/0203521 A1 Aug. 28, 2008

Related U.S. Application Data

(62) Division of application No. 11/193,202, filed on Jul. 28, 2005, now Pat. No. 7,351,616.

(30) Foreign Application Priority Data

Jul. 30, 2004 (JP) .................................. 2004-222996

(51) Int. Cl.
*H01L 27/12* (2006.01)
(52) U.S. Cl. .. 257/347; 257/353; 257/507; 257/E27.112
(58) Field of Classification Search .................. 257/507, 257/E27.112, 67, 69, 347, 353
See application file for complete search history.

(56) References Cited

U.S. PATENT DOCUMENTS

| 7,008,847 | B2* | 3/2006 | Park ............................. 438/264 |
| 7,332,399 | B2 | 2/2008 | Kato |
| 7,344,997 | B2 | 3/2008 | Kato |
| 2002/0076899 | A1 | 6/2002 | Skotnicki et al. |
| 2002/0088971 | A1* | 7/2002 | Tezuka et al. ................... 257/19 |
| 2007/0126034 | A1 | 6/2007 | Sakai et al. |
| 2007/0184588 | A1 | 8/2007 | Furukawa et al. |
| 2008/0122024 | A1 | 5/2008 | Kato |

FOREIGN PATENT DOCUMENTS

| JP | 07-211917 | 8/1995 |
| JP | 2001-102442 | 4/2001 |
| JP | 2002-299591 | 10/2002 |
| JP | 2003-158091 | 5/2003 |
| JP | 2003-218232 | * 7/2003 |
| JP | 2005322830 A | 11/2005 |
| JP | 2005354024 A | 12/2005 |
| JP | 2006-041417 | 2/2006 |
| JP | 2006041331 A | 2/2006 |
| KR | 1998-069868 | 10/1998 |
| WO | WO-2004/044975 A1 | 5/2004 |
| WO | WO-2005036638 A1 | 4/2005 |

* cited by examiner

*Primary Examiner* — Tan N Tran
(74) *Attorney, Agent, or Firm* — Nutter McClennen & Fish LLP; John J. Penny, Jr.; Christina M. Sperry

(57) ABSTRACT

A semiconductor substrate comprising: a semiconductor base; dielectric layers of mutually different film thicknesses formed on the semiconductor base; and semiconductor layers of mutually different film thicknesses formed on the dielectric layers.

12 Claims, 37 Drawing Sheets

(a)

(b)

(c)

(a)

(b)

(a)

(b)

(a)

(b)

(a)

(b)

(a)

(b)

SEMICONDUCTOR SUBSTRATE, SEMICONDUCTOR DEVICE, METHOD FOR MANUFACTURING SEMICONDUCTOR SUBSTRATE, AND METHOD FOR MANUFACTURING SEMICONDUCTOR DEVICE

This application is a divisional application of U.S. application Ser. No. 11/193,202, from which priority is claimed under 35 U.S.C. §120.

TECHNICAL FIELD

The present invention relates to semiconductor substrates, semiconductor devices, methods for manufacturing semiconductor substrates, and methods for manufacturing semiconductor devices, and it is particularly suitable for application to field effect transistors formed on a SOI (Silicon On Insulator) substrate.

BACKGROUND OF THE TECHNOLOGY

The utilities of field effect transistors formed on a SOI substrate are attracting attention because of their readiness of element isolation, latch-up free characteristics, small source/drain junction capacitances and the like.

Also, for example, Japanese Laid-open Patent Application HEI 7-211917 (JP '917) describes a method of forming high breakdown voltage field effect transistors having a drain breakdown voltage of about several hundred V on a SOI substrate. Also, Japanese Laid-open Patent Application 2003-158091 (JP '091) describes a method of forming field effect transistors that are miniaturized on the other of submicron on a SOI substrate.

It is noted here that optimum film thicknesses of SOI layers and BOX layers differ for semiconductor elements of different usages. In other words, for a high breakdown voltage field effect transistor having a drain breakdown voltage of about several hundred V, its BOX layer needs to have a larger film thickness in order to secure the breakdown strength of the BOX layer and the back-channel threshold breakdown strength, and the film thickness of the BOX layer amounts to the order of μm. For example, in the case of a high breakdown voltage field effect transistor having a drain breakdown voltage of about 50V, the film thickness of the BOX layer needs to be about several hundred nm, and in the case of a high breakdown voltage field effect transistor having a drain breakdown voltage of about 500V, the film thickness of the BOX layer needs to be about several μm.

On the other hand, for a field effect transistor that is miniaturized on the order of submicron, its BOX layer needs to have a smaller film thickness in order to suppress reduction of threshold values by short-channel effects, and thus the film thickness of the BOX layer becomes to be on the order of several hundred angstrom. For example, when the effective channel length becomes 0.1 μm or less, the film thickness of the SOI layer needs to be set to 50 nm or less, and the film thickness of the BOX layer needs to be set to 50-100 nm.

In the meantime, accompanied by the advent of ubiquitous societies, the SOC (System On Chip) technology that enables mix-mounting of devices of various breakdown voltages and digital and analog devices on a single chip is attracting attention, for further promotion of miniaturization of information portable devices, reduction of power consumption, greater multiple functions, and greater capacities.

Also, Japanese Laid-open Patent Application 2002-299591 (JP '591) describes a method of forming semiconductor elements for different usages in active layers having thicknesses suitable for the respective usages by embedding dielectric films at different depths from a main surface of a semiconductor substrate, in order to realize the SOC on a SOI substrate.

However, according to the methods described in JP '917, JP '091, and JP '591, the film thickness of the BOX layer is maintained at constant by the SOI substrate. For this reason, for forming semiconductor elements for different usages on a SOI substrate, the semiconductor elements need to be independently formed on different SOI substrates for the respective usages, which causes a problem that presents an obstruction to realization of the SOC.

Also, according to the method described in JP '591, in order to embed dielectric films at different depths from the main surface of the semiconductor substrate, oxygen ions are injected in a silicon substrate with different energies. For this reason, physical damages are generated in the silicon substrate, and the crystallinity and purity of the SOI layer deteriorate, thereby causing a problem in that, when semiconductor elements are formed in the SOI layer, their characteristics deteriorate due to PN junction leakages or the like. In particular, according to the method described in JP '591, the amount of injecting oxygen ions needs to be increased in order to increase the film thickness of the BOX layer, such that damages at the time of ion injection and stresses caused by expansion of oxygen films increase. For this reason, there are problems in that crystal defects occur in the SOI layers, and the reliability of the semiconductor device deteriorates.

Furthermore, when a method in which two wafers are bonded together to increase the film thickness of the BOX layer is used, one of the wafers needs to be removed almost entirely, which causes a problem in that the resources are wasted. Also, in the method of bonding two wafers, differences in film thicknesses of SOI layers become greater, and BOX layers of different film thicknesses cannot be formed on a common SOI substrate, which causes a problem that presents an obstruction to realization of the SOC. Also, when a SOI layer is formed on BOX layers of different film thicknesses, step differences are generated in the surface of the SOI layer, which causes a problem in that processing accuracy of the semiconductor manufacturing process deteriorates.

Accordingly, it is an object of at least one embodiment of the present invention to provide semiconductor substrates, semiconductor devices, a method for manufacturing semiconductor substrates, and a method for manufacturing semiconductor devices, which can improve flatness of surfaces of semiconductor layers, and are capable of making film thicknesses of dielectric layers and semiconductor layers different from one another.

SUMMARY OF THE INVENTION

To solve the problems described above, a semiconductor substrate in accordance with an embodiment of the present invention is characterized in comprising: a semiconductor base; dielectric layers of mutually different film thicknesses formed on the semiconductor base; and semiconductor layers of mutually different film thicknesses formed on the dielectric layers.

By this, the film thicknesses of the dielectric layers and semiconductor layers can be set so as to match with the respective usages of semiconductor elements, and semiconductor elements for mutually different usages can be formed on a common SOI substrate. For this reason, while short-channel effects can be suppressed, field effect transistors can be further miniaturized, and while breakdown strength of dielectric layers and PN junction breakdown strength can be secured, high breakdown voltage field effect transistors can be formed on a common SOI substrate. For this reason, a System-On-Chip can be realized on a common SOI substrate, and miniaturization, lower power consumption, greater multiple functions and greater capacities of semiconductor devices can be promoted.

Also, a semiconductor substrate in accordance with an embodiment of the present invention is characterized in comprising: a semiconductor base; dielectric layers of mutually different film thicknesses formed on the semiconductor base; semiconductor layers of mutually different film thicknesses formed on the dielectric layers; and semiconductor elements for mutually different usages formed on the semiconductor layers.

By this, semiconductor elements do not need to be formed separately on independent SOI substrates for different usages, and semiconductor elements for different usages in which the film thickness of each dielectric layer and semiconductor layer is optimized can be formed on a common SOI substrate, such that greater performance of a system-on-chip can be achieved.

Also, a semiconductor device in accordance with an embodiment of the present invention is characterized in comprising: a semiconductor base; dielectric layers of mutually different film thicknesses formed on the semiconductor base; semiconductor layers of mutually different film thicknesses formed on the dielectric layers; and semiconductor elements for mutually different usages formed on the semiconductor base and the semiconductor layers.

Further, a method for manufacturing a semiconductor substrate in accordance with an embodiment of the present invention is characterized in comprising: a step of forming, on a semiconductor base, a plurality of laminated layered structures, each composed of a second semiconductor layer having a smaller selection ratio at etching than a first semiconductor layer, laminated on the first semiconductor layer; a step of forming a first groove that penetrates the first semiconductor layers and the second semiconductor layers and exposes the semiconductor base; a step of forming a supporting body for supporting the second semiconductor layers on the semiconductor base on side walls of the first semiconductor layers and the second semiconductor layers in the first groove; a step of forming a second groove that exposes at least a part of the first semiconductor layers with the supporting body formed on the sidewall through the second semiconductor layers; a step of selectively etching the first semiconductor layers through the second groove to form a void section in a position where the first semiconductor layers existed; and a step of completely thermally oxidizing the second semiconductor layers for at least one layer through the void section to form a dielectric layer disposed below the second semiconductor layer at an uppermost layer.

By this, the second semiconductor layers can be supported on the semiconductor base through the supporting body formed in the first groove, and etching gas or etching liquid can be brought in contact with the first semiconductor layers through the second groove. For this reason, while the second semiconductor layers can be stably supported on the semiconductor base, the first semiconductor layers below the second semiconductor layers can be removed, and while physical damages that may be inflicted on the second semiconductor layers can be suppressed, a dielectric layer can be formed below the second semiconductor layer at the uppermost layer. As a result, by appropriately setting the number of layers of the first semiconductor layers that are exposed through the second semiconductor layers, and the film thicknesses of the first and second semiconductor layers, the film thicknesses of both of the dielectric layers and the semiconductor layers thereon can be made different from one another, the crystallinity and purity of the semiconductor layers disposed on the dielectric layers can be improved, and the reliability of the system-on-chip can be improved.

Also, a method for manufacturing a semiconductor substrate in accordance with an embodiment of the present invention is characterized in that the second semiconductor layer and the supporting body consist of single crystal Si, and the first semiconductor layer consists of single crystal SiGe.

By this, lattice matching among the second semiconductor layers, the supporting body and the first semiconductor layers can be made, and the selection ratio at the time of etching the first semiconductor layers can be made greater than that of the second semiconductor layers and the supporting body. For this reason, the second semiconductor layers of good crystal quality can be formed on the first semiconductor layers, the supporting body can be stably formed in the first groove, and the film thicknesses of both of the dielectric layers and semiconductor layers thereon can be made different from one another without damaging the quality of the second semiconductor layers.

Also, a method for manufacturing a semiconductor substrate in accordance with an embodiment of the present invention is characterized in that the first groove and the second groove are disposed in element isolation regions.

By this, element isolation of the second semiconductor layers in a transverse direction and a longitudinal direction can be conducted in a batch, and grooves for removing the first semiconductor layers under the second semiconductor layers do not need to be provided in element forming regions. For this reason, while an increase in the number of steps can be suppressed, SOI transistors can be formed, and an increase in the chip size can be suppressed, such that the cost of SOI transistors can be reduced.

Also, a method for manufacturing a semiconductor substrate in accordance with an embodiment of the present invention is characterized in that the second semiconductor layer at the uppermost layer has a greater film thickness compared to the second semiconductor layers at lower layers.

By this, even when at least one layer of the second semiconductor layers is completely thermally oxidized, the second semiconductor layer at the topmost layer can be prevented from completely disappearing, and the second semiconductor layer can be disposed on the dielectric layer.

Further, a method for manufacturing a semiconductor substrate in accordance with an embodiment of the present invention is characterized in further comprising the step of forming an oxidation prevention film on the second semiconductor layer at the uppermost layer, before thermal oxidation of the second semiconductor layers is conducted.

By this, even when at least one layer of the second semiconductor layers is completely thermally oxidized, the surface of the second semiconductor layer at the uppermost layer can be prevented from being thermally oxidized, and the second semiconductor layer at the uppermost layer can be prevented from completely disappearing.

Also, a method for manufacturing a semiconductor substrate in accordance with an embodiment of the present invention is characterized in that all of the second semiconductor layers below the second semiconductor layer at the uppermost layer are completely thermally oxidized.

By this, the film thickness of the dielectric layer below the second semiconductor layer at the uppermost layer can be increased by increasing the number of layers of the second semiconductor layers. For this reason, while suppressing deterioration of the crystallinity and purity of the second semiconductor layers, the breakdown strength of the BOX layers and the back-channel threshold breakdown strength can be secured, and higher breakdown voltages of field effect transistors can be achieved.

Also, a method for manufacturing a semiconductor substrate in accordance with an embodiment of the present invention is characterized in that the first semiconductor layer has a film thickness that is substantially equal to the sum of a downwardly increased portion of film thickness of the second semiconductor layer immediately above the first semiconductor layer caused by thermal oxidation and an upwardly increased portion of film thickness of the second semiconductor layer immediately below the first semiconductor layer caused by thermal oxidation.

By this, an increase in the film thickness of the second semiconductor layer by thermal oxidation can be absorbed by a gap of the void section, and the void section can be completely closed with the dielectric layer. For this reason, stress on the dielectric layer can be suppressed, an increase in the thermal resistance can be suppressed, deterioration of the crystallinity of the second semiconductor layer on the dielectric layer can be suppressed, and the heat dissipation property of the second semiconductor layer can be improved.

Moreover, a method for manufacturing a semiconductor substrate in accordance with an embodiment of the present invention is characterized in that the first semiconductor layer has a film thickness that is smaller than the sum of a downwardly increased portion of film thickness of the second semiconductor layer immediately above the first semiconductor layer caused by thermal oxidation and an upwardly increased portion of film thickness of the second semiconductor layer immediately below the first semiconductor layer caused by thermal oxidation.

By this, an increase in the film thickness of the semiconductor layer by thermal oxidation can be made greater than a gap of the void section, such that the second semiconductor layer at an upper layer can be lifted up at the time of thermal oxidation of the second semiconductor layer at a lower layer. For this reason, the height of the second semiconductor layer can be adjusted, and the flatness of the second semiconductor layer can be improved.

Furthermore, a method for manufacturing a semiconductor substrate in accordance with an embodiment of the present invention is characterized in that the first semiconductor layer has a film thickness that is greater than the sum of a downwardly increased portion of film thickness of the second semiconductor layer immediately above the first semiconductor layer caused by thermal oxidation and an upwardly increased portion of film thickness of the second semiconductor layer immediately below the first semiconductor layer caused by thermal oxidation.

By this, an increase in the film thickness of the second semiconductor layer by thermal oxidation can be absorbed by a gap of the void section. For this reason, stress on the dielectric layer can be suppressed, and deterioration of the crystallinity of the second semiconductor layer on the dielectric layer can be suppressed.

Also, a method for manufacturing a semiconductor device in accordance with an embodiment of the present invention is characterized in comprising: a step of forming, on a semiconductor substrate, a first laminated layered structure composed of a second semiconductor layer having a smaller selection ratio at etching than a first semiconductor layer, laminated on the first semiconductor layer; a step of forming a step difference in a part of an area of the first laminated layered structure by selectively half-etching the second semiconductor layer at the uppermost layer; a step of forming, in a portion at the step difference of the first laminated layered structure, a second laminated layered structure composed of a fourth semiconductor layer having a smaller selection ratio at etching than a third semiconductor layer, laminated on the third semiconductor layer, in a manner that the third semiconductor layer is set to have a film thickness equal to a film thickness of the first semiconductor layer; a step of forming a first groove that penetrates the first semiconductor layer through the fourth semiconductor layer and exposes the semiconductor base; a step of forming a supporting body for supporting the second and fourth semiconductor layers on the semiconductor base on side walls of the first semiconductor layer through the fourth semiconductor layer in the first groove; a step of forming, in a first area divided by the first groove, a second groove that exposes at least a part of the first semiconductor layer through the second semiconductor layer; a step of forming, in a second area divided by the first groove, a third groove that exposes at least a part of the third semiconductor layer through the fourth semiconductor layer; a step of forming void sections under the second and fourth semiconductor layers by selectively etching the first and third semiconductor layers through the second groove and the third groove; a step of forming dielectric layers disposed below the second and fourth semiconductor layers by thermally oxidizing the second and fourth semiconductor layers through the void sections; and a step of forming semiconductor elements for mutually different usages at the second and fourth semiconductor layers, respectively.

By this, the second and fourth semiconductor layers can be supported on the semiconductor base through the supporting body formed in the first groove, the heights of the first and third semiconductor layers that are exposed through the second and fourth semiconductor layers, respectively, can be made different from each other in the first area and the second area, and etching gas or etching liquid can be brought in contact with the first and third semiconductor layers through the second groove and the third groove.

For this reason, the second and fourth semiconductor layers can be stably supported on the semiconductor base, the first and third semiconductor layers disposed below the second and fourth semiconductor layers, respectively, can be removed, and the heights of the first and third semiconductor layers that are removed from below the second and fourth semiconductor layers, respectively, can be made different from each other in the first area and the second area. Also, by setting the film thickness of the third semiconductor layer to be equal to the film thickness of the first semiconductor layer, increases in the heights in the first area and the second area can be made coincide with each other, even when the film thickness of the second and fourth semiconductor layers increases by thermal oxidation.

As a result, the heights of dielectric layers to be formed by thermal oxidation after the first and third semiconductor layers are removed can be made different in the first area and the second area, and the film thicknesses of the semiconductor layers in the first area and the second area can be made mutually different, and the flatness of the surface between the second and fourth semiconductor layers can be improved.

Also, a method for manufacturing a semiconductor device in accordance with an embodiment of the present invention is characterized in comprising: a step of forming, on a-semiconductor substrate, a first laminated layered structure composed of a second semiconductor layer having a smaller selection ratio at etching than a first semiconductor layer, laminated on the first semiconductor layer; a step of forming, in a portion of an area of the first laminated layered structure, a second laminated layered structure composed of a fourth semiconductor layer having a smaller selection ratio at etching than a third semiconductor layer, laminated on the third semiconductor layer, in a manner that the third semiconductor layer is set to have a film thickness greater than a film thickness of the first semiconductor layer; a step of forming a first groove that penetrates the first semiconductor layer through the fourth semiconductor layer and exposes the semiconductor base; a step of forming a supporting body for supporting the second and fourth semiconductor layers on the semiconductor base on side walls of the first semiconductor layer through the fourth semiconductor layer in the first groove; a step of forming, in a first area divided by the first groove, a second groove that exposes at least a part of the first semiconductor layer through the second semiconductor layer; a step of forming, in a second area divided by the first groove, a third groove that exposes at least a part of the third semiconductor layer through the fourth semiconductor layer; a step of forming void sections under the second and fourth semiconductor layers by selectively etching the first and third semiconductor layers through the second groove and the third groove; a step of forming dielectric layers disposed below the second and fourth semiconductor layers by thermally oxidizing the second and fourth semiconductor layers through the void sections; and a step of forming semiconductor elements for mutually different usages at the second and fourth semiconductor layers, respectively.

By this, while leaving the first semiconductor layer remained in the second area, the first semiconductor layer in the first area can be removed, and the third semiconductor layer in the second area can be removed. For this reason, by appropriately adjusting the film thicknesses and the number of layers of the first and third semiconductor layers, the film thicknesses of the dielectric layers below the second semiconductor layer and the fourth semiconductor layer can be made different from one another. Also, by making the film thicknesses of the second semiconductor layer and the fourth semiconductor layer different from each other, the film thicknesses of the semiconductor layers on the dielectric layers can be made different from each other. Further, by setting the film thickness of the third semiconductor layer to be greater than the film thickness of the first semiconductor layer, the height of the first area can be made elevated compared to the second area, based on increases in the film thickness of the second and fourth semiconductor layers. For this reason, the flatness of the surface of the semiconductor layer can be improved, and the film thicknesses of both of the dielectric layers and the semiconductor layers can be made different from one another.

DETAILED DESCRIPTION OF THE PREFERRED EMBODIMENTS

A semiconductor device and a method for manufacturing the same in accordance with embodiments of the present invention are described below with reference to the accompanying drawings.

Figure 1:
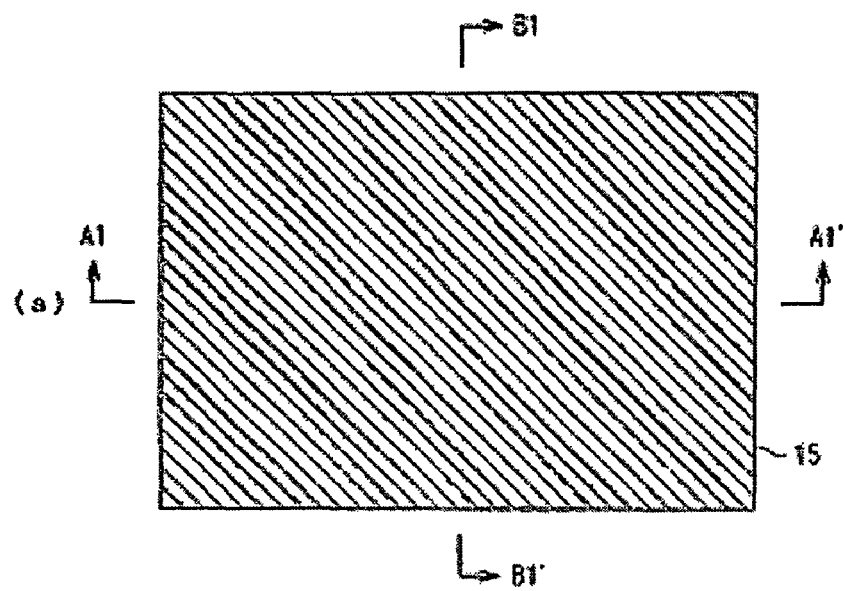
FIGS. 1(a)-1(c) are a plan view and cross-sectional views showing a method for manufacturing a semiconductor device in accordance with a first embodiment.
Figure 1:
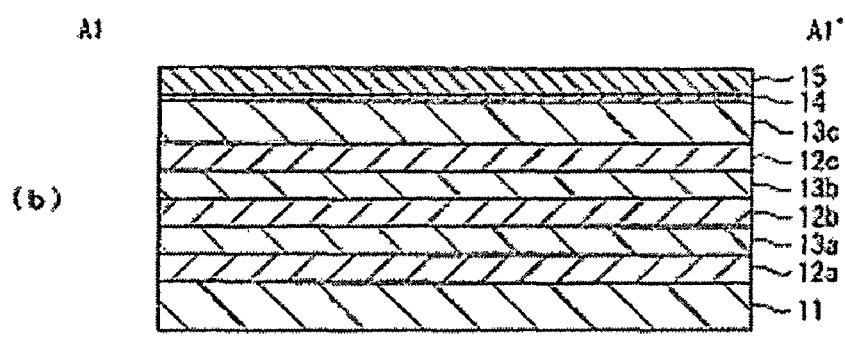
Figure 1:
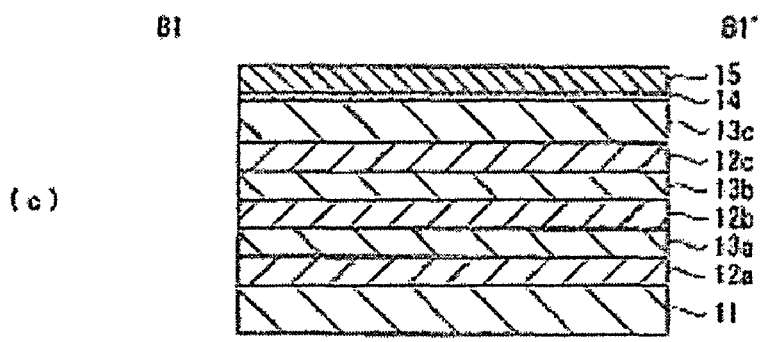
Figure 2:
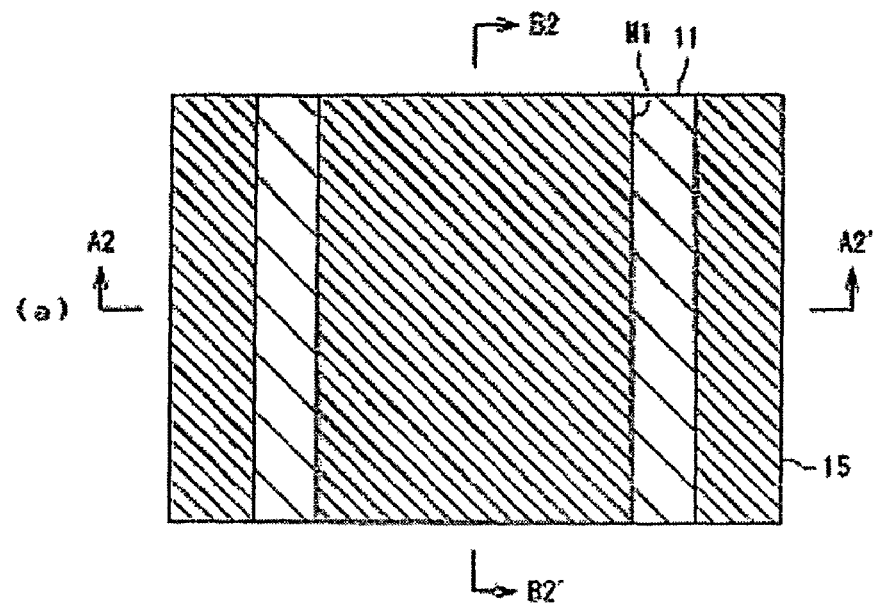
FIGS. 2(a)-2(c) are a plan view and cross-sectional views showing the method for manufacturing a semiconductor device in accordance with the first embodiment.
Figure 2:
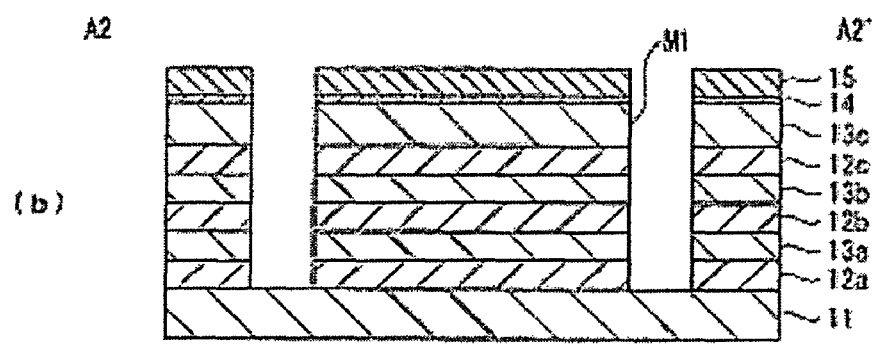
Figure 2:
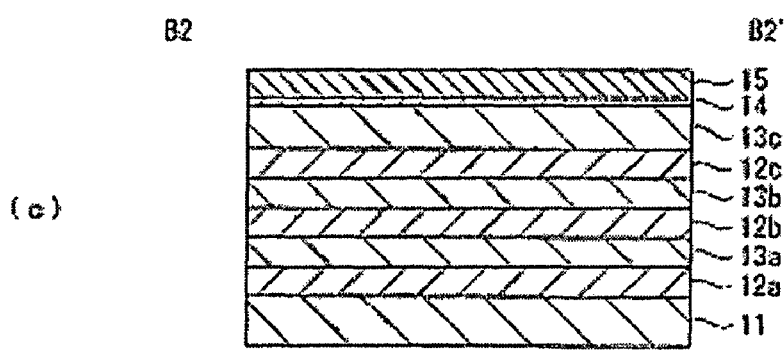
Figure 3:
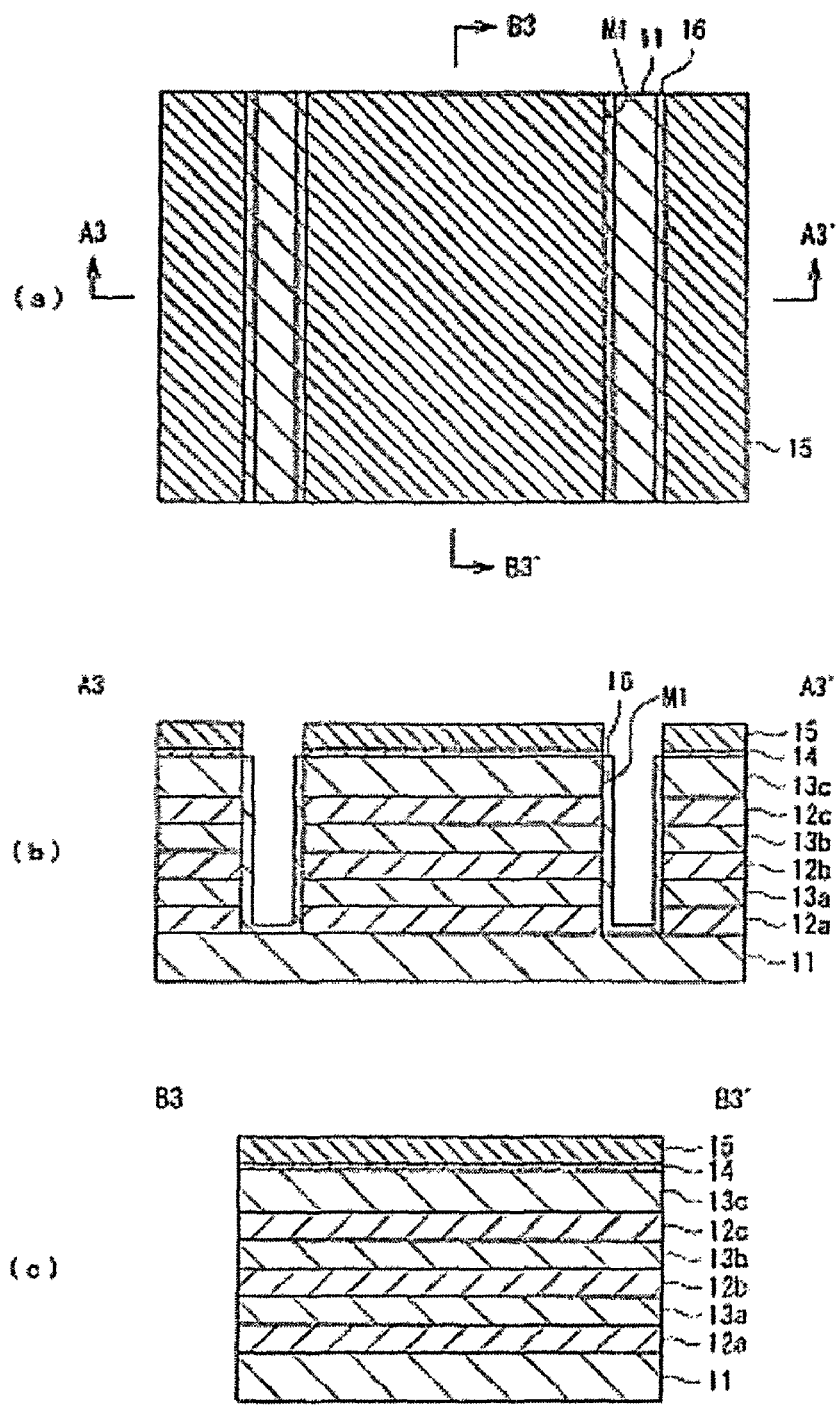
FIGS. 3(a)-3(c) are a plan view and cross-sectional views showing the method for manufacturing a semiconductor device in accordance with the first embodiment.
Figure 4:
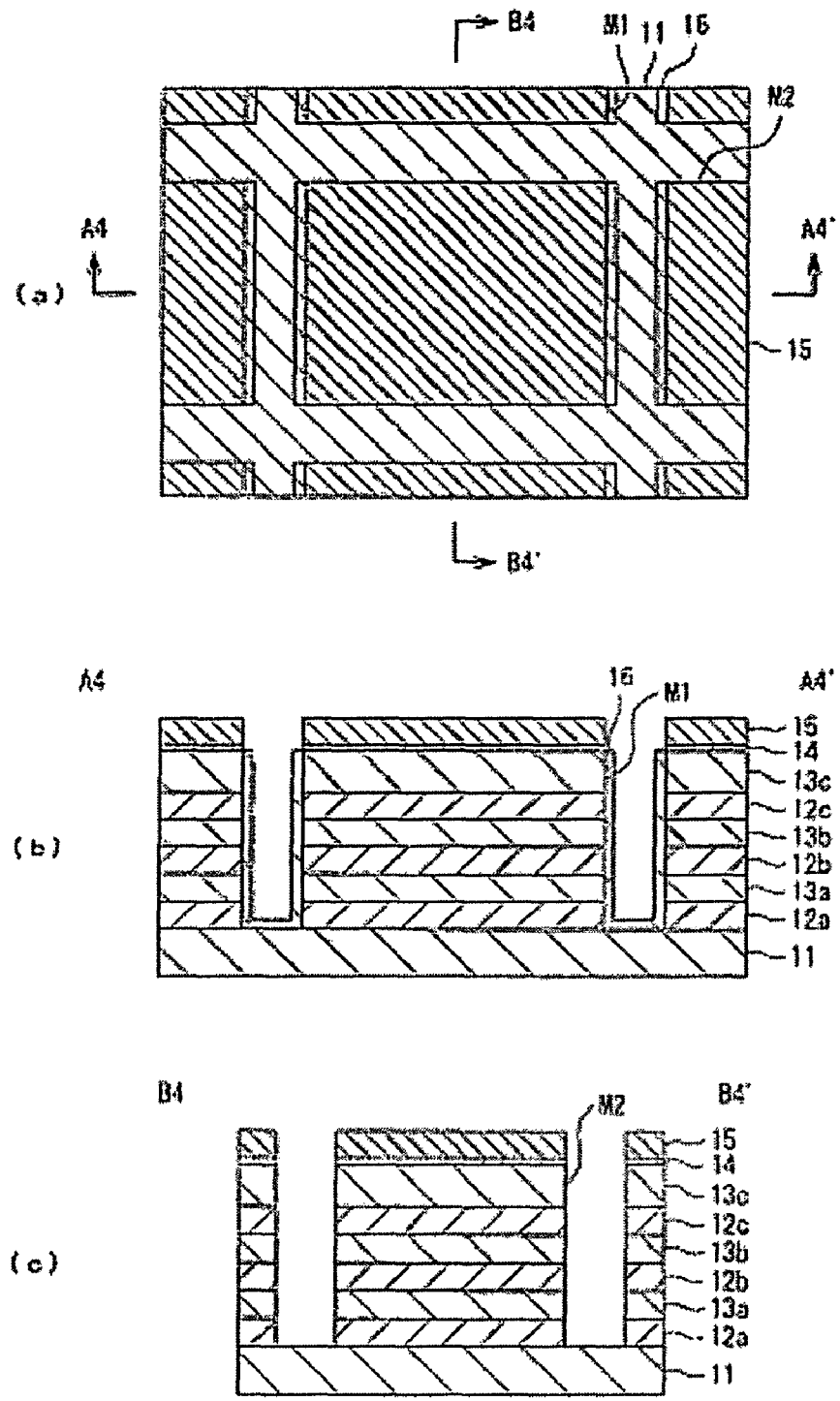
FIGS. 4(a)-4(c) are a plan view and cross-sectional views showing the method for manufacturing a semiconductor device in accordance with the first embodiment.
Figure 5:
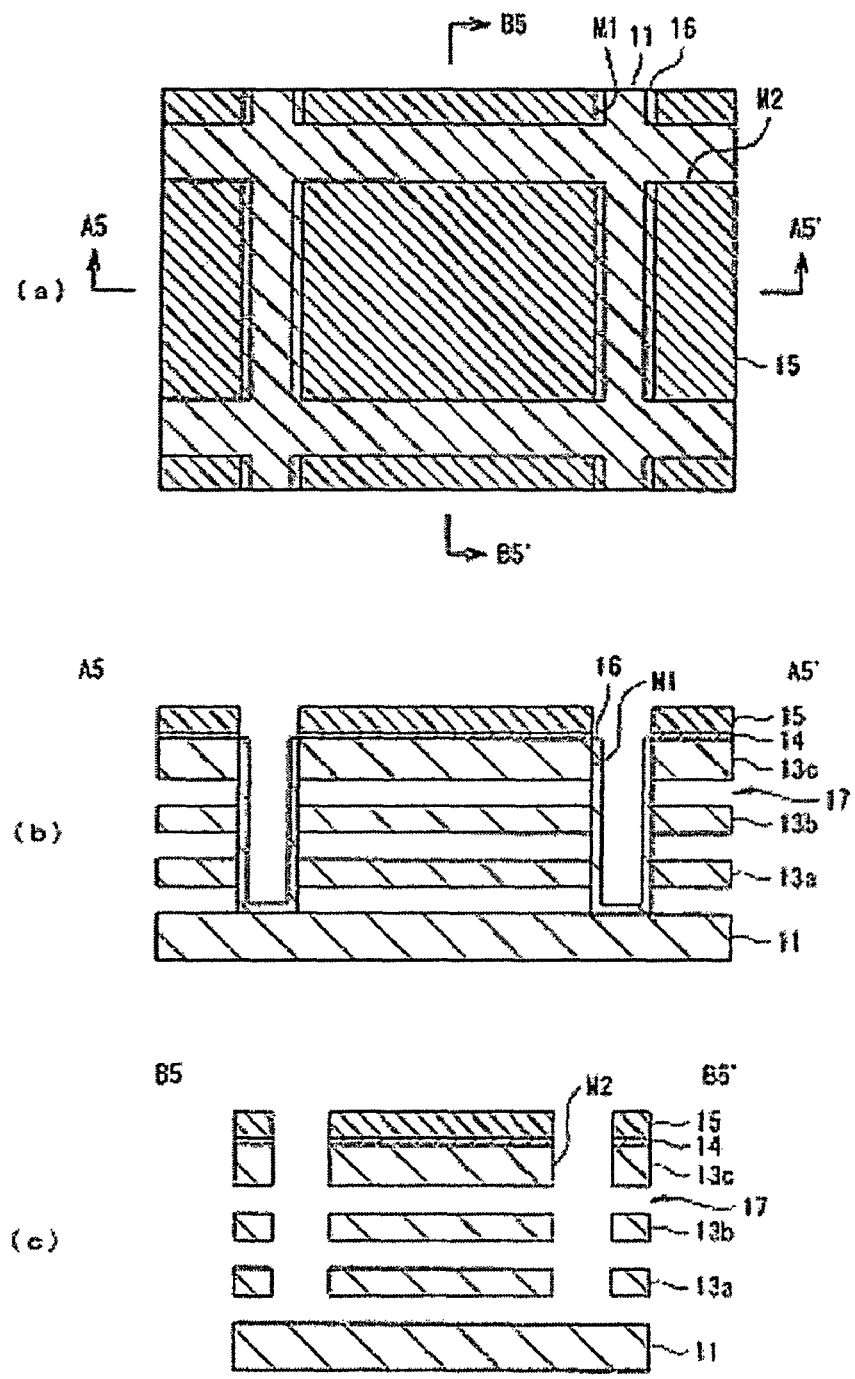
FIGS. 5(a)-5(c) are a plan view and cross-sectional views showing the method for manufacturing a semiconductor device in accordance with the first embodiment.
Figure 6:
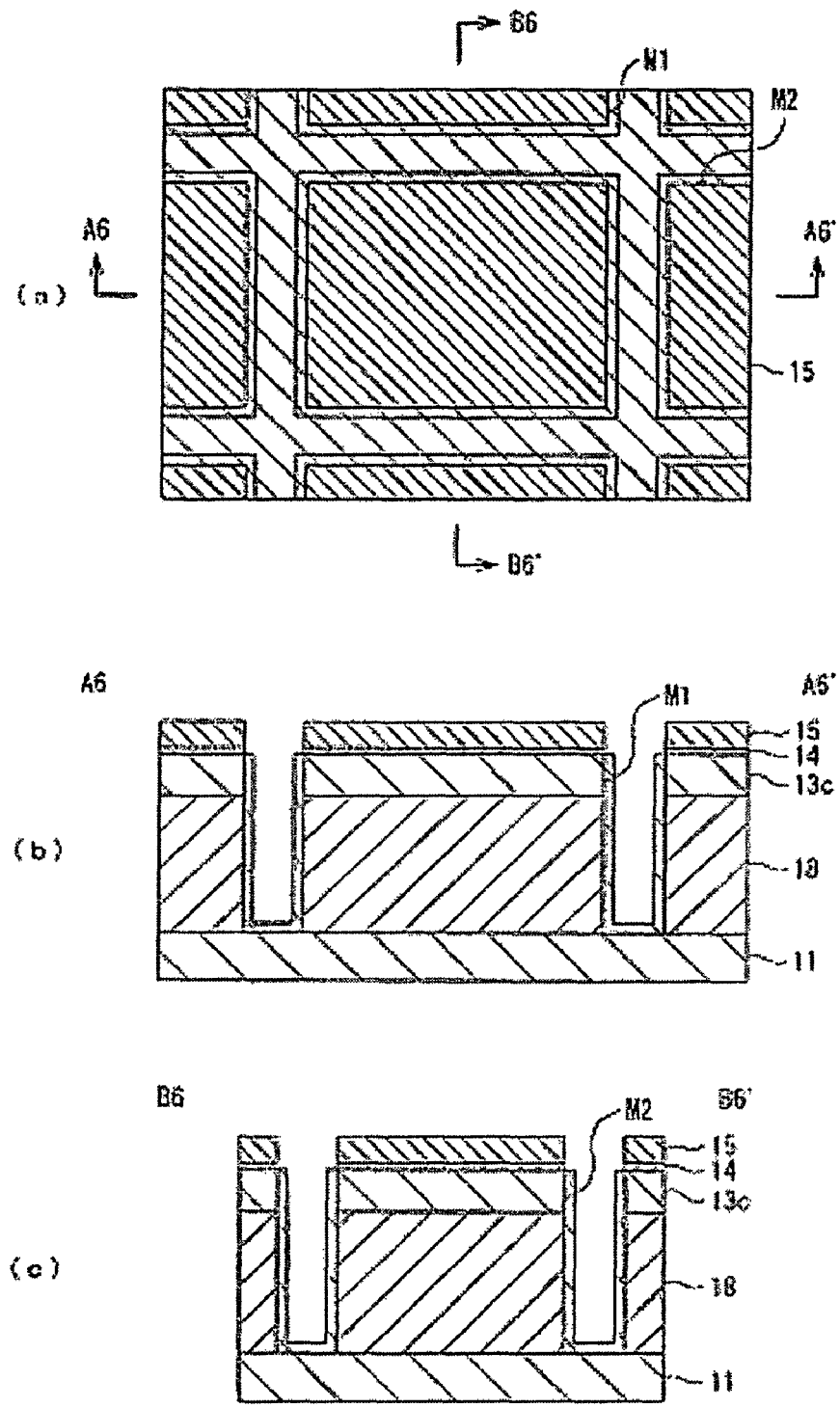
FIGS. 6(a)-6(c) are a plan view and cross-sectional views showing the method for manufacturing a semiconductor device in accordance with the first embodiment.
Figure 7:
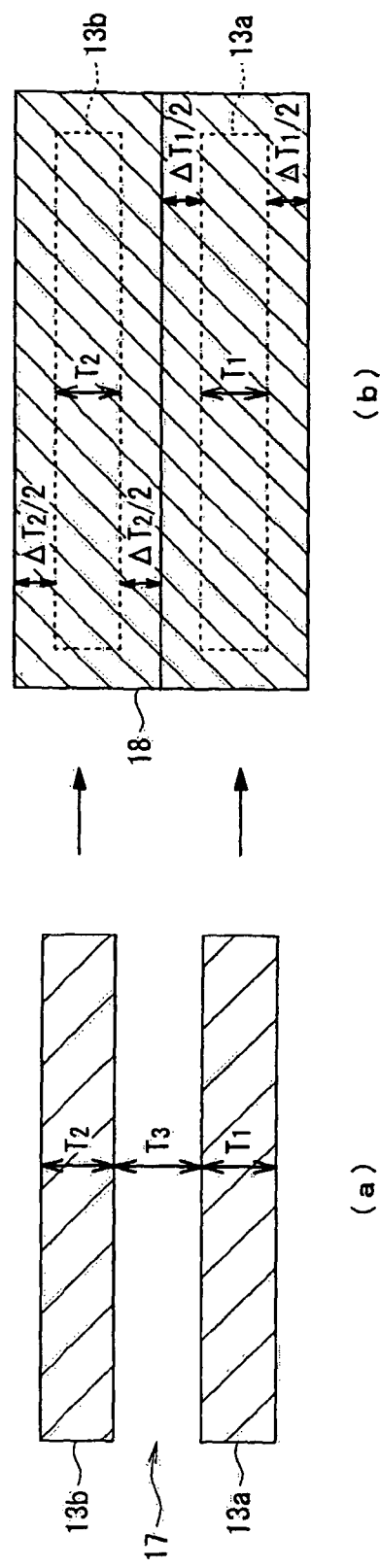
FIGS. 7(a)-7(b) are cross-sectional views showing the method for manufacturing a semiconductor device in accordance with the first embodiment.
Figure 8:
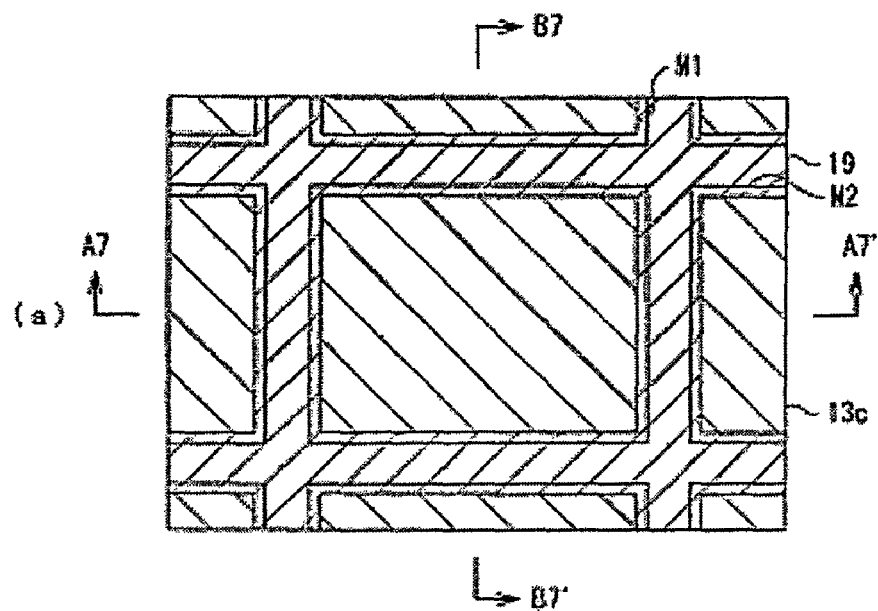
FIGS. 8(a)-8(c) are a plan view and cross-sectional views showing the method for manufacturing a semiconductor device in accordance with the first embodiment.
Figure 8:
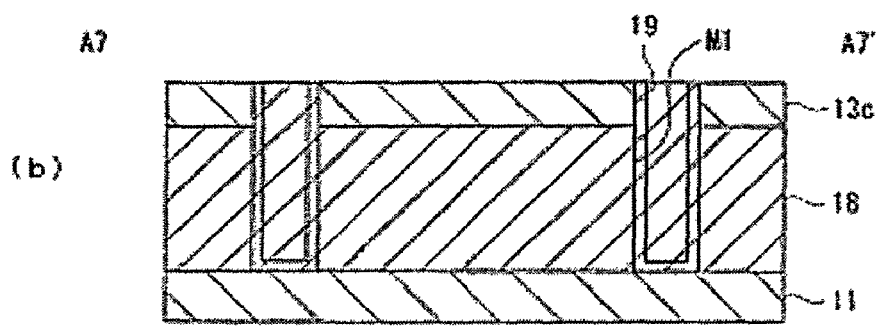
Figure 8:
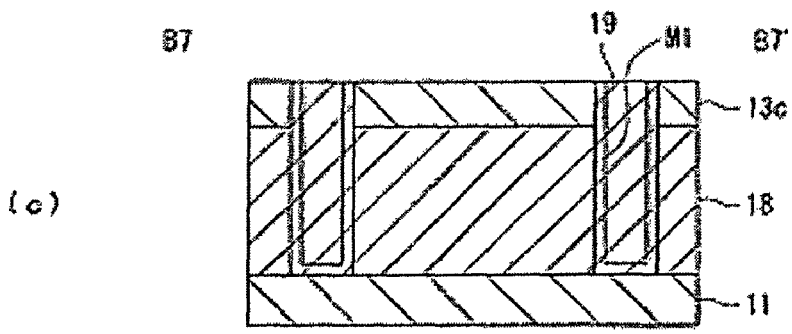

FIG. 1-FIG. 8 are plan views and cross-sectional views showing a method for manufacturing a semiconductor device in accordance with a first embodiment of the present invention.

Referring to FIGS. 1(a)-1(c), first single crystal semiconductor layers 12a-12c and second single crystal semiconductor layers 13a-13c are alternately laminated on a semiconductor substrate 11. It is noted that, for example, Si, Ge, SiGe, GaAs, InP, GaP, GaN, SiC and the like can be used as materials for the semiconductor substrate 11, the first single crystal semiconductor layers 12a-12c, and the second single crystal semiconductor layers 13a-13c.

It is noted here that the first single crystal semiconductor layers 12a-12c can use materials having a selection ratio at etching greater than that of the semiconductor substrate 11 and the second single crystal semiconductor layers 13a-13c. In particular, when the semiconductor substrate 11 consists of Si, SiGe may preferably be used as the first single crystal semiconductor layers 12a-12c, and Si for the second single crystal semiconductor layers 12a-13c. By this, lattice matching can be achieved among the first single crystal semiconductor layers 12a-12c and the second single crystal semiconductor layers 13a-13c, and selection ratios can be secured among the first single crystal semiconductor layers 12a-12c and the second single crystal semiconductor layers 13a-13c.

Then, the second single crystal semiconductor layer 13c is thermally oxidized to thereby form a sacrificial oxide film 14 on a surface of the second single crystal semiconductor layer 13c. Then, an oxidation prevention film 15 is formed on the entire surface of the sacrificial oxide film 14 by a CVD method or the like. It is noted that, for example, a silicon nitride film can be used as the oxidation prevention film 15.

Next, as shown in FIGS. 2(a)-2(c), by using a photolithography technique and an etching technique, the oxidation prevention film 15, the sacrificial oxide film 14, the first single crystal semiconductor layers 12a-12c and the second single crystal semiconductor layers 13a-13c are patterned, to thereby form grooves M1 that expose the semiconductor substrate 11 in a predetermined direction.

It is noted that, when the semiconductor substrate 11 is exposed, etching may be stopped at the surface of the semiconductor substrate 11, or recessed portions may be formed in the semiconductor substrate 11 by over-etching the semiconductor substrate 11. Also, arrangement positions of the grooves M1 may be made to correspond to a part of element isolation regions.

Next, as shown in FIGS. 3(a)-3(b). 3, supporting bodies 16, that are formed in films on side walls of the first single crystal semiconductor layers 12a-12c and the second single crystal semiconductor layers 13a-13c, and supports the second single crystal semiconductor layers 13a-13c on the semiconductor substrate 11, are formed in the grooves M1. It is noted that, when forming the supporting body 16 in a film on the side walls of the first single crystal semiconductor layers 12a-12c and the second single crystal semiconductor layers 13a-13c, epitaxial growth of semiconductor can be used. It is noted here that, by using the epitaxial growth of semiconductor, the supporting body 16 can be selectively formed on the side surfaces of the first single crystal semiconductor layers 12a-12c and the second single crystal semiconductor layers 13a-13c and the surface of the semiconductor substrate 11. It is noted that, for example, Si, Ge, SiGe, SiC, SiSn, PbS, GaAs, InP, GaP, GaN, ZnSe or the like can be used as a material for the supporting body 16. In particular, when the semiconductor substrate 11 and the second single crystal semiconductor layers 13a-13c consist of Si, and the first single crystal semiconductor layers 12a-12c consist of SiGe, Si may preferably be used as a material of the supporting body 16.

By this, lattice matching can be made among the supporting body 16 and the first single crystal semiconductor layers 12a-12c, and selection ratios can be secured among the supporting body 16 and the first single crystal semiconductor layers 12a-12c. Also, by using semiconductor such as Si as a material of the supporting body 16, the three-dimensional cubic structure by the semiconductor can be maintained, even when the first single crystal semiconductor layers 12a-12c are removed. For this reason, the chemical resistance property and mechanical stress resistance property can be improved, such that a stable element isolation process with good reproducibility can be realized. It is noted that, besides semiconductors, a dielectric such as a silicon oxide film may be used as the material of the supporting body 16.

Next, as shown in FIGS. 4(a)-4(c), the oxidation prevention film 15, the sacrificial oxide film 14, the first single crystal semiconductor layers 12a-12c and the second single crystal semiconductor layers 13a-13c are patterned by using a photolithography technique and an etching technique, whereby grooves M2 that expose the semiconductor substrate 11 are formed along a direction orthogonal to the grooves M1. It is noted that, when the semiconductor substrate 11 is exposed, etching may be stopped at the surface of the semiconductor substrate 11, or recessed sections may be formed in the semiconductor substrate 11 by over-etching the semiconductor substrate 11. Also, arrangement positions of the grooves M2 may be made to correspond to the element isolation regions.

Next, as shown in FIGS. 5(a)-5(c), etching gas or etching liquid is brought in contact with the first single crystal semiconductor layers 12a-12c through the grooves M2, whereby the first single crystal semiconductor layers 12a-12c are removed by etching. Then, void sections 17 are formed between the semiconductor substrate 11 and the second single crystal semiconductor layer 13a, and between the second single crystal semiconductor layers 13a and 13b, and 13b and 13c.

It is noted here that, by providing the supporting bodies 16 in the grooves M1, the second single crystal semiconductor layers 13a-13c can be supported on the semiconductor substrate 11 even when the first single crystal semiconductor layers 12a-12c are removed; and by providing the grooves M2 independently of the grooves M1, etching gas or etching liquid can be brought in contact with the first single crystal semiconductor layers 12a-12c disposed under the second single crystal semiconductor layers 13a-13c, respectively. For this reason, the void sections 17 can be formed between the semiconductor substrate 11 and the second single crystal semiconductor layer 13a, and among the second single crystal semiconductor layers 13a through 13c, without damaging the crystal quality of the second single crystal semiconductor layers 13a-13c.

It is noted that, when the semiconductor substrate 11, the second single crystal semiconductor layers 13a-13c and the supporting body 16 consist of Si, and the first single crystal semiconductor layers 12a-12c consist of SiGe, it is desirable to use nitric-hydrofluoric acid as an etching liquid for the first single crystal semiconductor layers 12a-12c. By this, a selection ratio between Si and SiGe that ranges from about 1:1000 to 1:10000 can be obtained, such that the first single crystal semiconductor layers 12a-12c can be removed while suppressing over-etching of the semiconductor substrate 11, the second single crystal semiconductor layers 13a-13c and the supporting body 16.

Next, as shown in FIGS. 6(a)-6(c), the semiconductor substrate 11, the second single crystal semiconductor layers 13a-13c and the supporting body 16 are thermally oxidized until the second single crystal semiconductor layers 13a and 13b disappear, thereby forming dielectric layers 18 under the second single crystal semiconductor layer 13c. It is noted here that, by having the second single crystal semiconductor layers 13a and 13b disappear, gaps between the second single crystal semiconductor layer 13c and the semiconductor substrate 11 can be completely embedded with the dielectric layers 18.

Then, by appropriately adjusting the film thickness and/or the number of layers of the first single crystal semiconductor layers 12a-12c and the second single crystal semiconductor layers 13a-13c, the film thicknesses of the second single crystal semiconductor layer 13c and the dielectric layer 18 can be adjusted.

However, as shown in FIGS. 7(a)-7(b), the film thickness $T_3$ of the first single crystal semiconductor layer 12b between the second single crystal semiconductor layers 13a and 13b that are set to film thicknesses $T_1$ and $T_2$, respectively, may preferably be set to a value of about $\Delta T_1/2 + \Delta T_2/2$, where $\Delta T_1/2$ and $\Delta T_2/2$ are increases in the film thickness of the second single crystal semiconductor layers 13a and 13b, respectively. By this, a gap of the void section 17 that is created when the first single crystal semiconductor layer 12b is removed can be made to correspond to increases in the film thickness due to oxidation of the second single crystal semiconductor layers 13a and 13b. For this reason, stress on the dielectric layer 18 can be suppressed, the void section 17 can be completely filled with the dielectric layer 18, and the dielectric layer 18 can be prevented from bulging due to oxidation of the second single crystal semiconductor layers 13a and 13b. For this reason, while an increase in the thermal resistance can be suppressed, deterioration of the crystallinity of the second single crystal semiconductor layer 13c on the dielectric layer 18 can be suppressed, and the flatness of the second single crystal semiconductor layer 13c can be maintained. Also, the width of each of the grooves M1 and M2 may preferably be set to be greater than expansions by thermal oxidation from two sides in a transverse direction of the second single crystal semiconductor layers 13a-13c.

Also, the film thickness of the second single crystal semiconductor layer 13c after element isolation can be defined by the film thickness of the second single crystal semiconductor layer 13c at the time of epitaxial growth and the film thickness of the dielectric layer 18 formed at the time of thermal oxidation of the second single crystal semiconductor layers 13a-13c. For this reason, the film thickness of the second single crystal semiconductor layer 13c can be accurately controlled, differences in the film thickness of the second single crystal semiconductor layer 13c can be reduced, and the film thickness of the second single crystal semiconductor layer 13c can be made smaller. Also, by providing the oxidation prevention film 15 over the second single crystal semiconductor layer. 13c, the surface of the second single crystal semiconductor layer 13c can be prevented from being thermally oxidized, and the dielectric layer 18 can be formed under the second single crystal semiconductor layer 13c.

Also, instead of providing the oxidation prevention film 15 on the second single crystal semiconductor layer 13c, the film thickness of the second single crystal semiconductor layer 13c may be set greater than the film thickness of the second single crystal semiconductor layers 13a and 13b. By this, even when the second single crystal semiconductor layers 13a and 13b are completely thermally oxidized, the second single crystal semiconductor layer 13c at the uppermost layer can be prevented from completely disappearing by thermal oxidation, and the second single crystal semiconductor layer 13c can be disposed on the dielectric layer 18.

After the dielectric layer 18 is formed, high-temperature annealing is conducted. By this, the dielectric layer 18 can be re-flowed, stress on the dielectric layer 18 can be alleviated, and the interface state can be reduced.

Next, as shown in FIGS. 8(a)-8(c), by using a CVD method or the like, a dielectric layer is deposited on the second single crystal semiconductor layer in a manner that the grooves M1 and M2 with the dielectric layer 18 formed on their side walls are embedded. Then, by using a CMP (chemical mechanical polishing) method or the like, the dielectric layer is planarized, thereby exposing the surface of the second single crystal semiconductor layer, and forming embedded dielectric layers 10 in the grooves M1 and M2. It is noted that, for example, $SiO_2$ or $Si_3N4$ may be used as the embedded dielectric layers 19. Then, field effect transistors may be formed in the second single crystal semiconductor layer 13c. By this, PN junction leakage at the field effect transistors can be suppressed, element isolation around and bottom surfaces of the field effect transistors can be achieved, characteristics of the field effect transistors can be improved, and the reliability of the field effect transistors can be improved.

Figure 9:
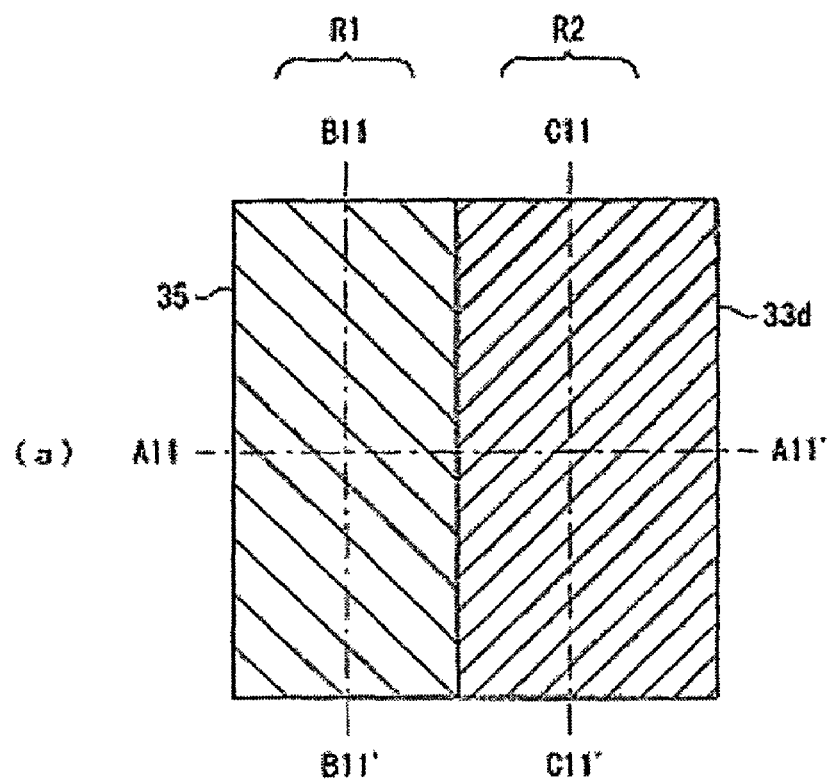
FIGS. 9(a)-9(b) are a plan view and a cross-sectional view showing a method for manufacturing a semiconductor device in accordance with a second embodiment.
Figure 9:
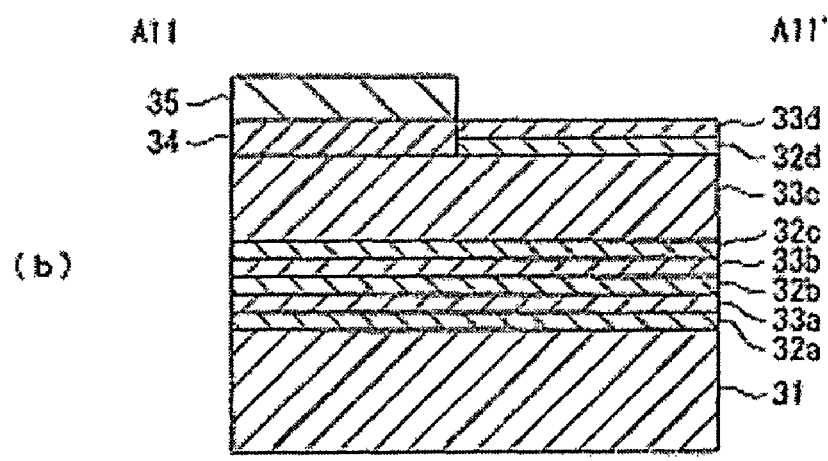
Figure 10:
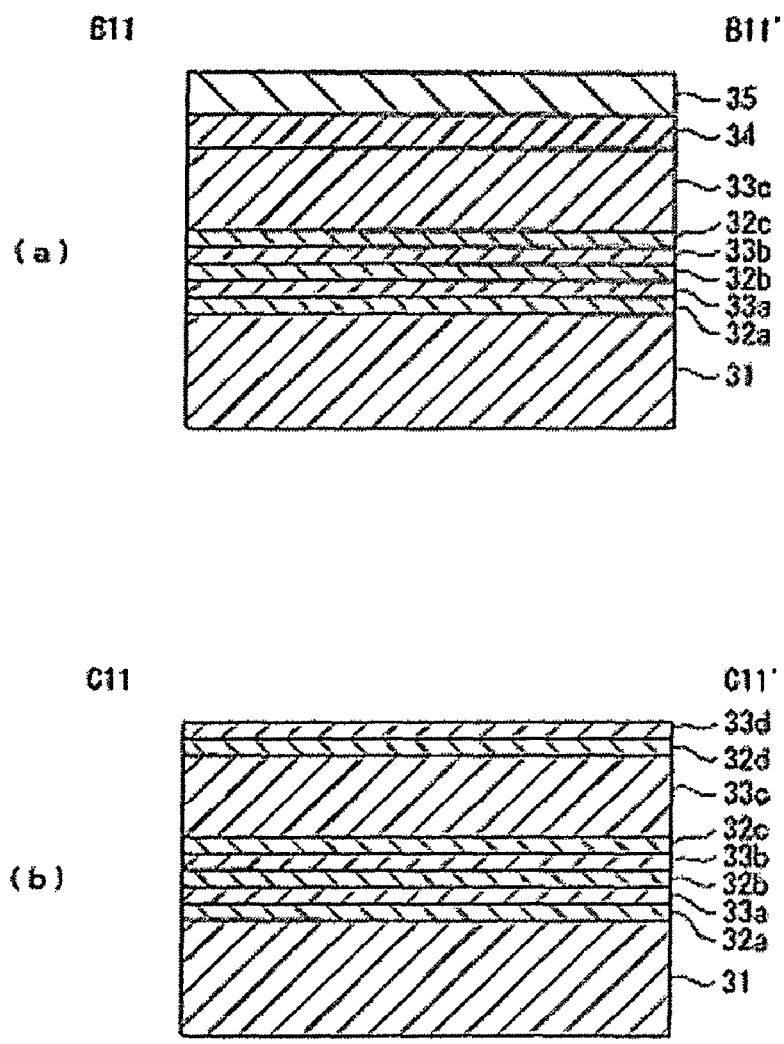
FIGS. 10(a)-10(b) are cross-sectional views showing the method for manufacturing the semiconductor device in accordance with the second embodiment.
Figure 11:
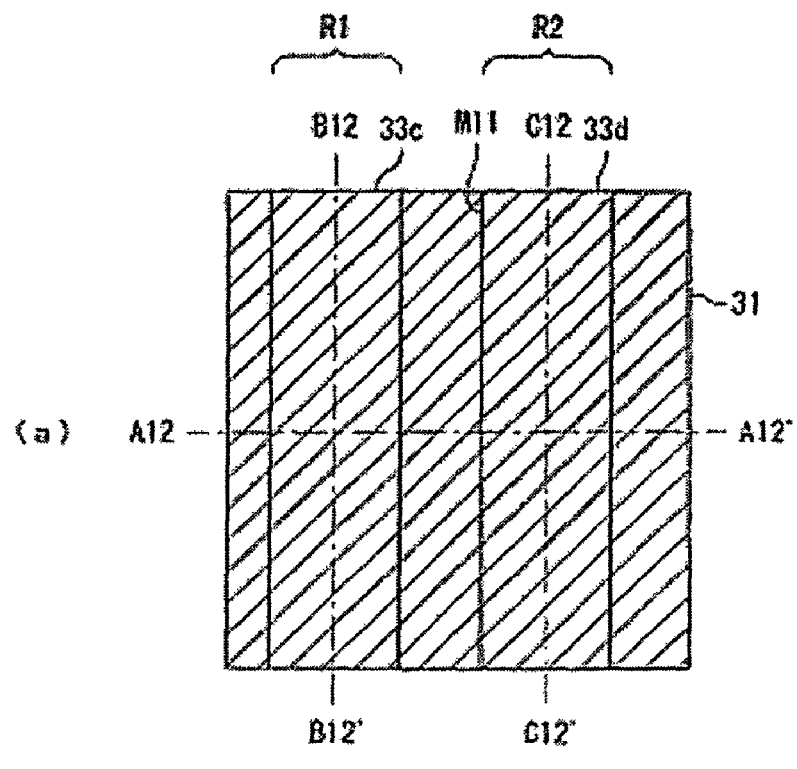
FIGS. 11(a)-11(b) are a plan view and a cross-sectional view showing the method for manufacturing the semiconductor device in accordance with the second embodiment.
Figure 11:
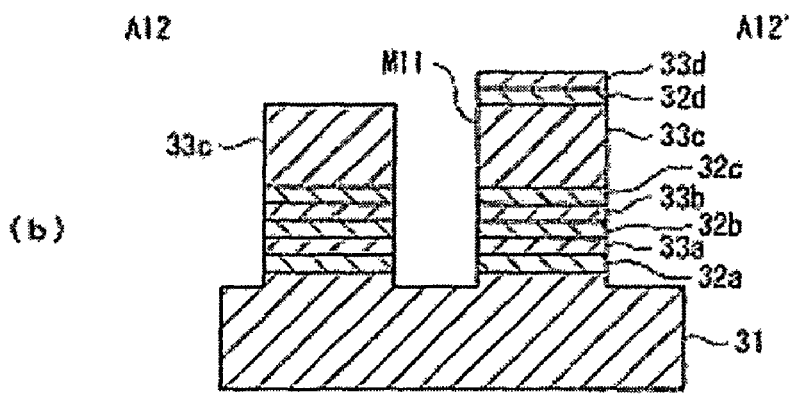
Figure 12:
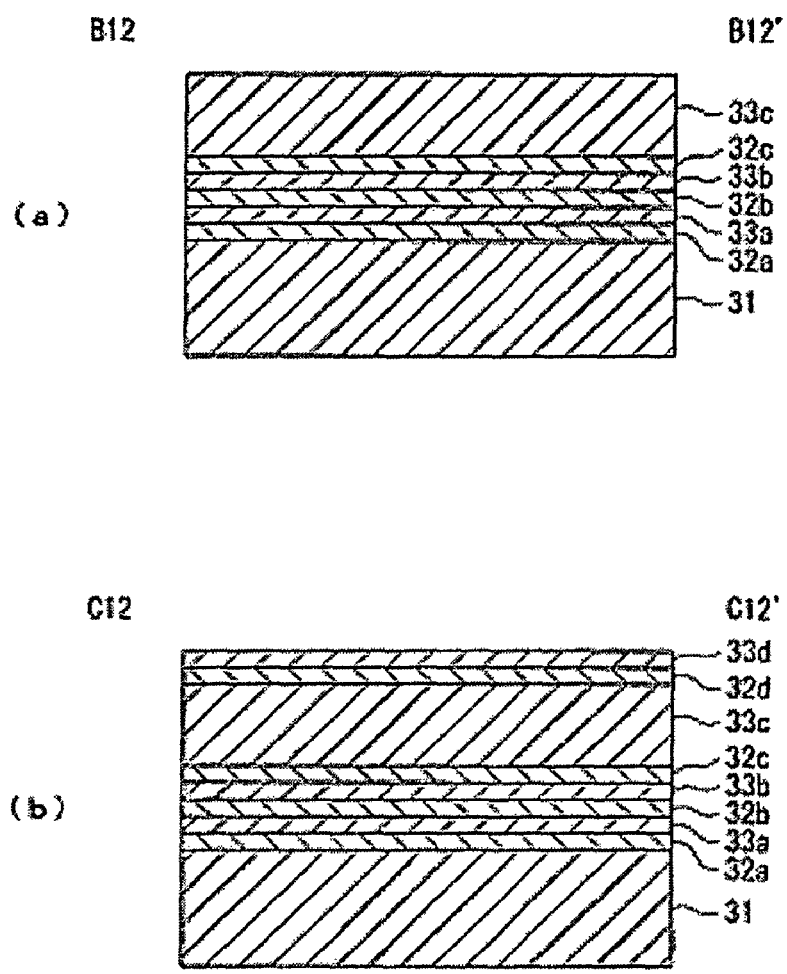
FIGS. 12(a)-12(b) are cross-sectional views showing the method for manufacturing the semiconductor device in accordance with the second embodiment.
Figure 13:
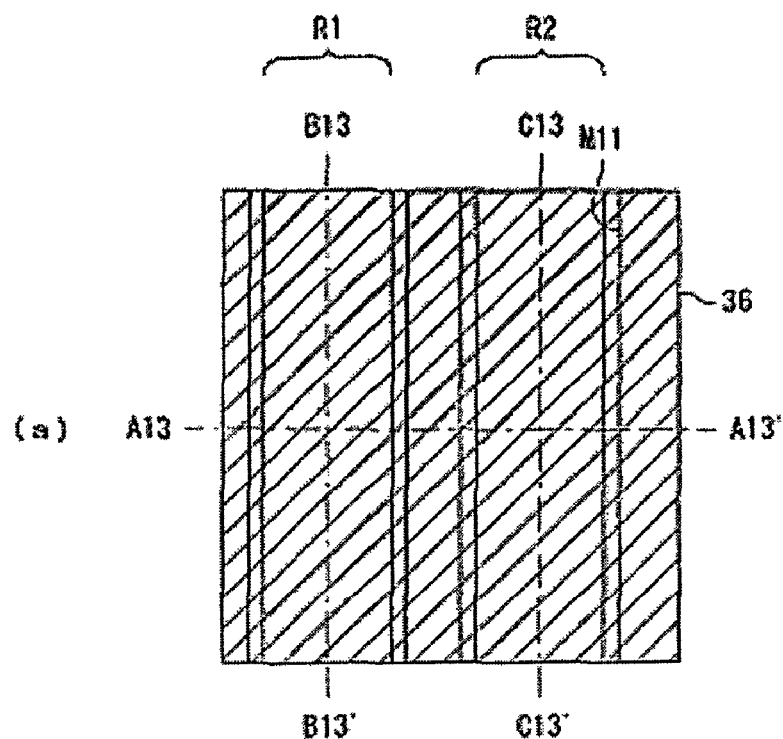
FIGS. 13(a)-13(b) are a plan view and a cross-sectional view showing the method for manufacturing the semiconductor device in accordance with the second embodiment.
Figure 13:
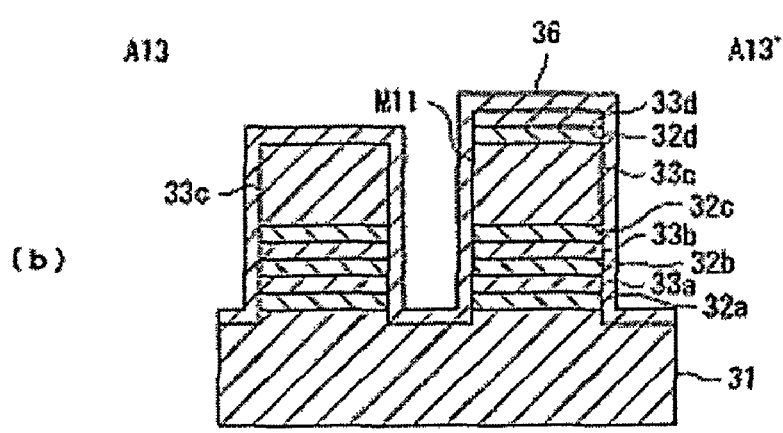
Figure 14:
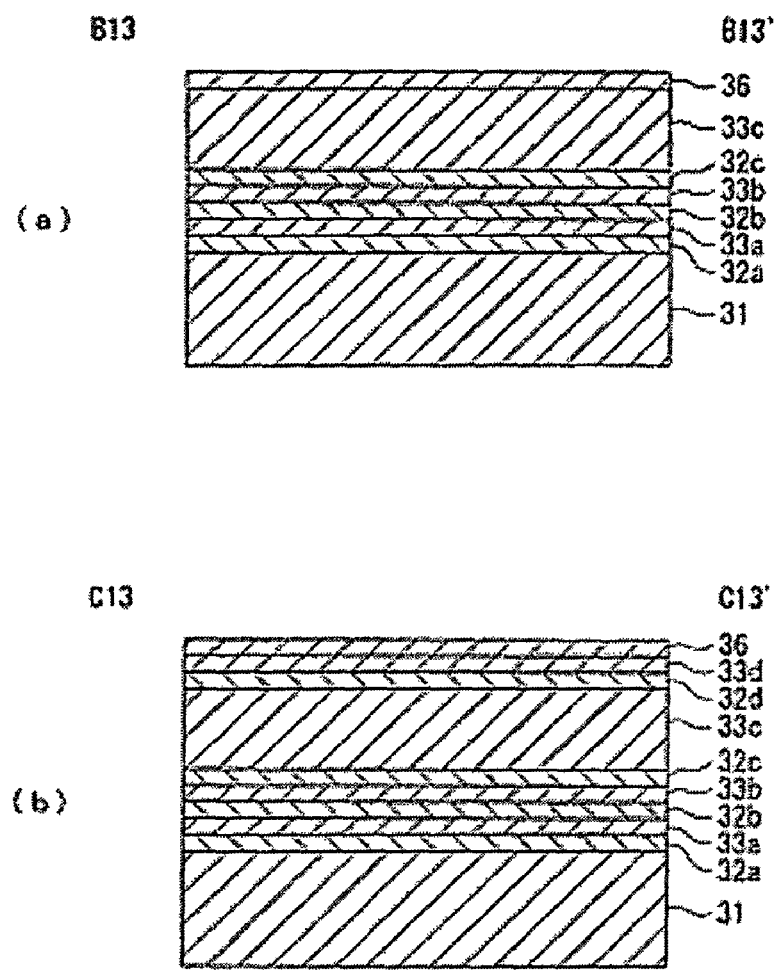
FIGS. 14(a)-14(b) are cross-sectional views showing the method for manufacturing the semiconductor device in accordance with the second embodiment.
Figure 15:
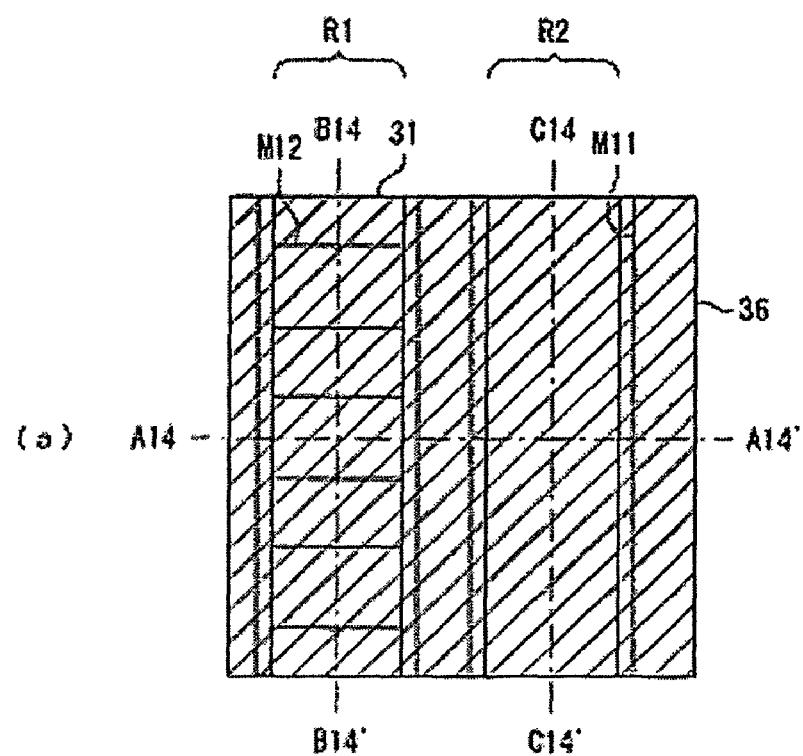
FIGS. 15(a)-15(b) are a plan view and a cross-sectional view showing the method for manufacturing the semiconductor device in accordance with the second embodiment.
Figure 15:
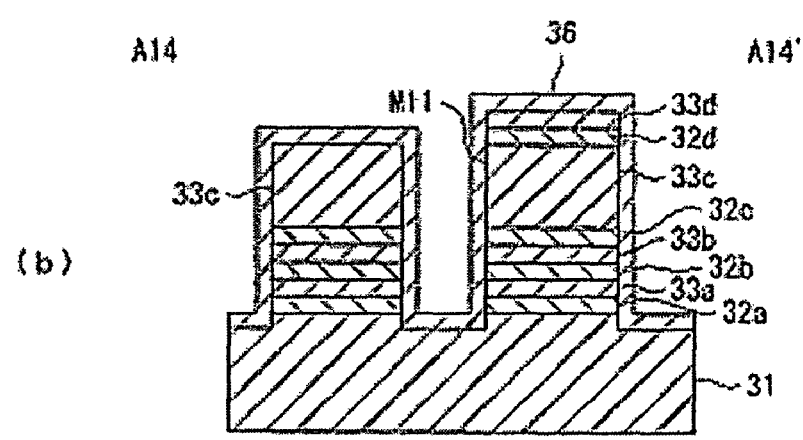
Figure 16:
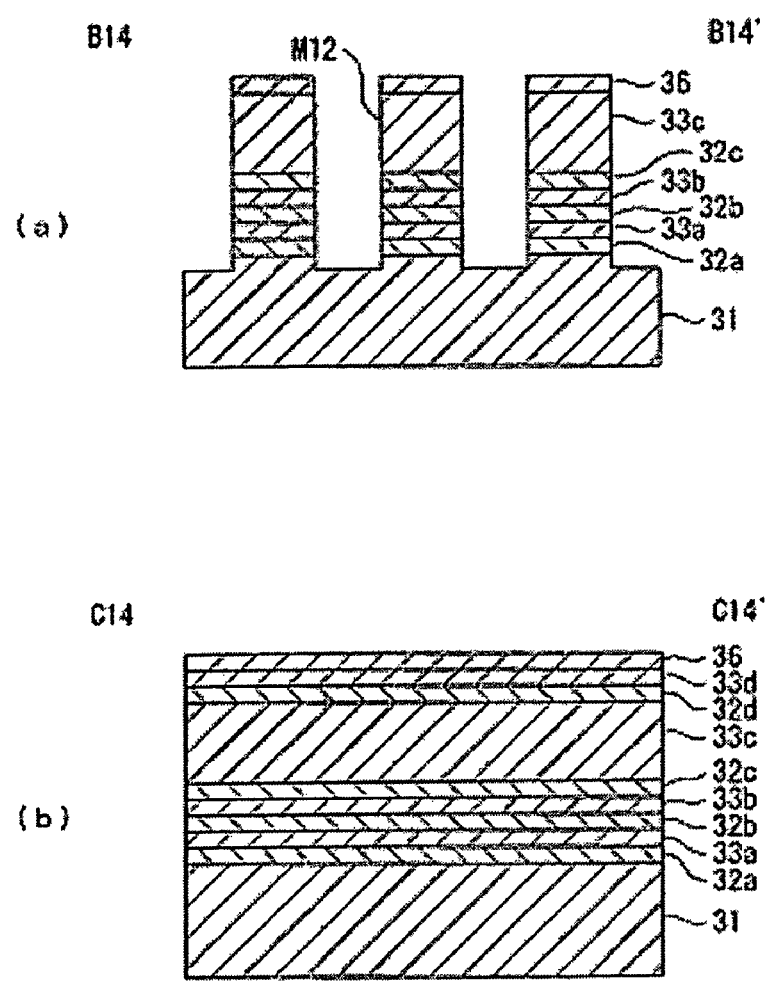
FIGS. 16(a)-16(b) are cross-sectional views showing the method for manufacturing the semiconductor device in accordance with the second embodiment.
Figure 17:
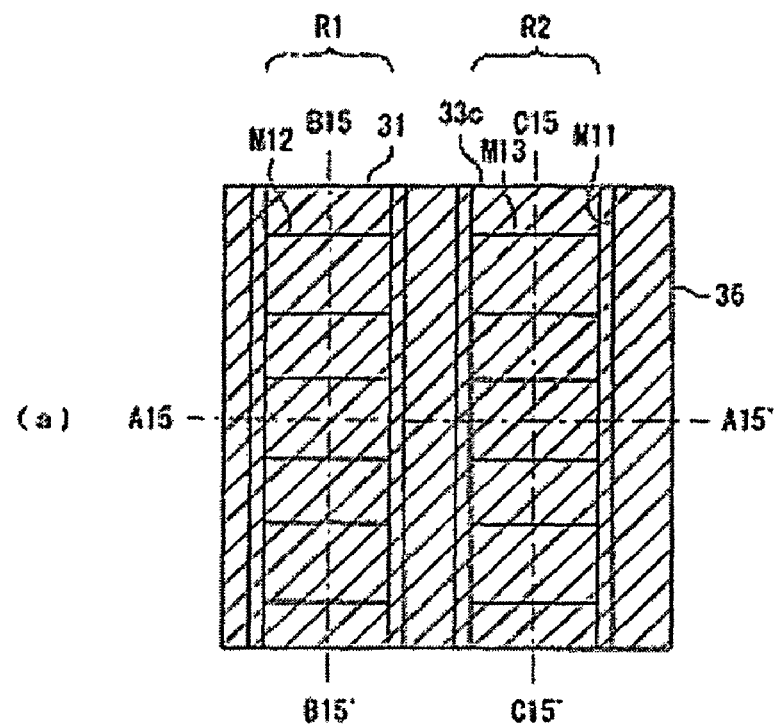
FIGS. 17(a)-17(b) are a plan view and a cross-sectional view showing the method for manufacturing the semiconductor device in accordance with the second embodiment.
Figure 17:
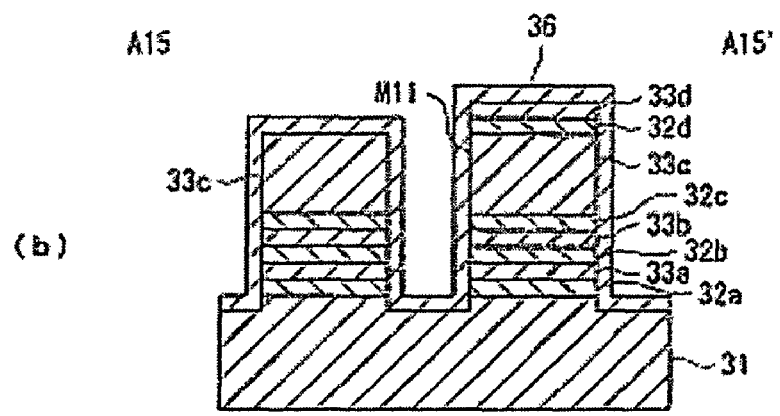
Figure 18:
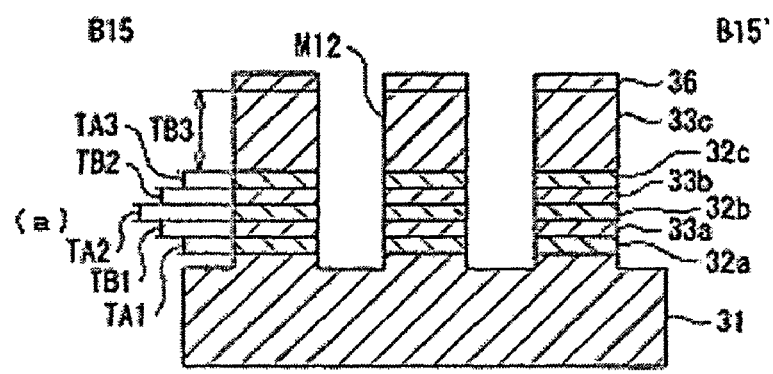
FIGS. 18(a)-18(b) are cross-sectional views showing the method for manufacturing the semiconductor device in accordance with the second embodiment.
Figure 18:
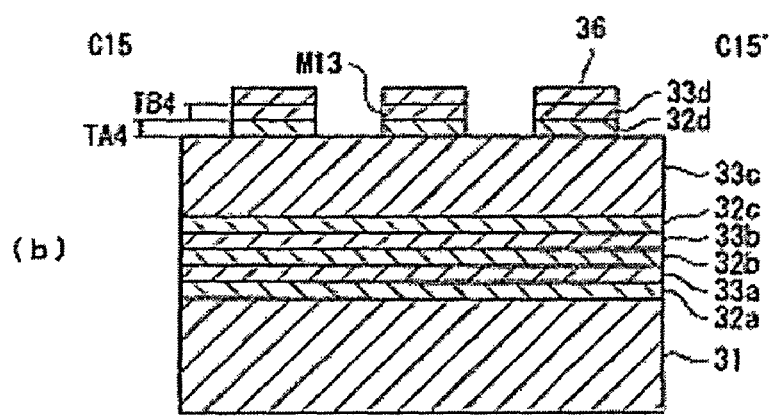
Figure 19:
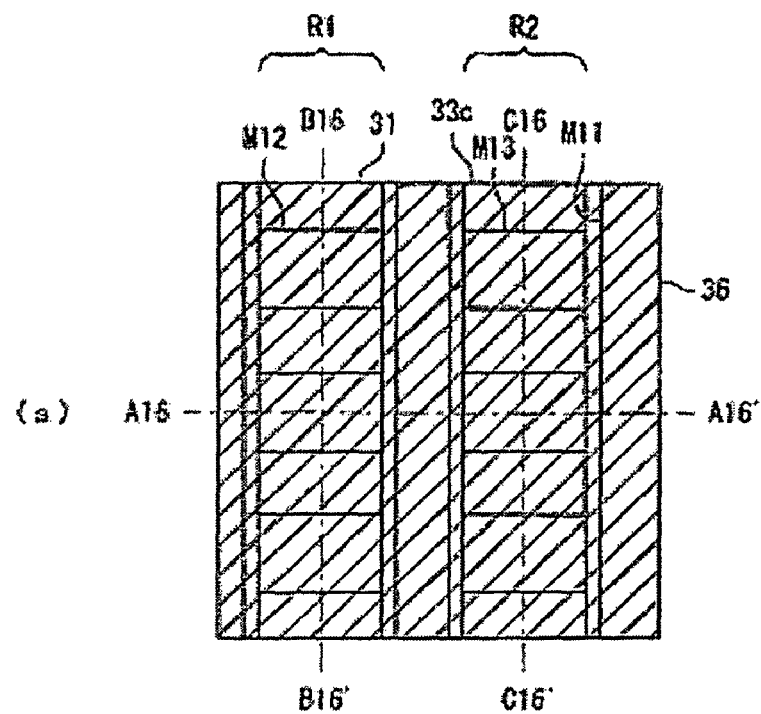
FIGS. 19(a)-19(b) are a plan view and a cross-sectional view showing the method for manufacturing the semiconductor device in accordance with the second embodiment.
Figure 19:
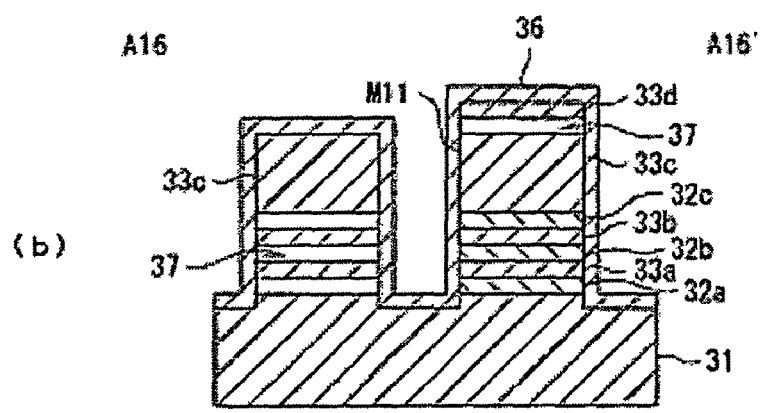
Figure 20:
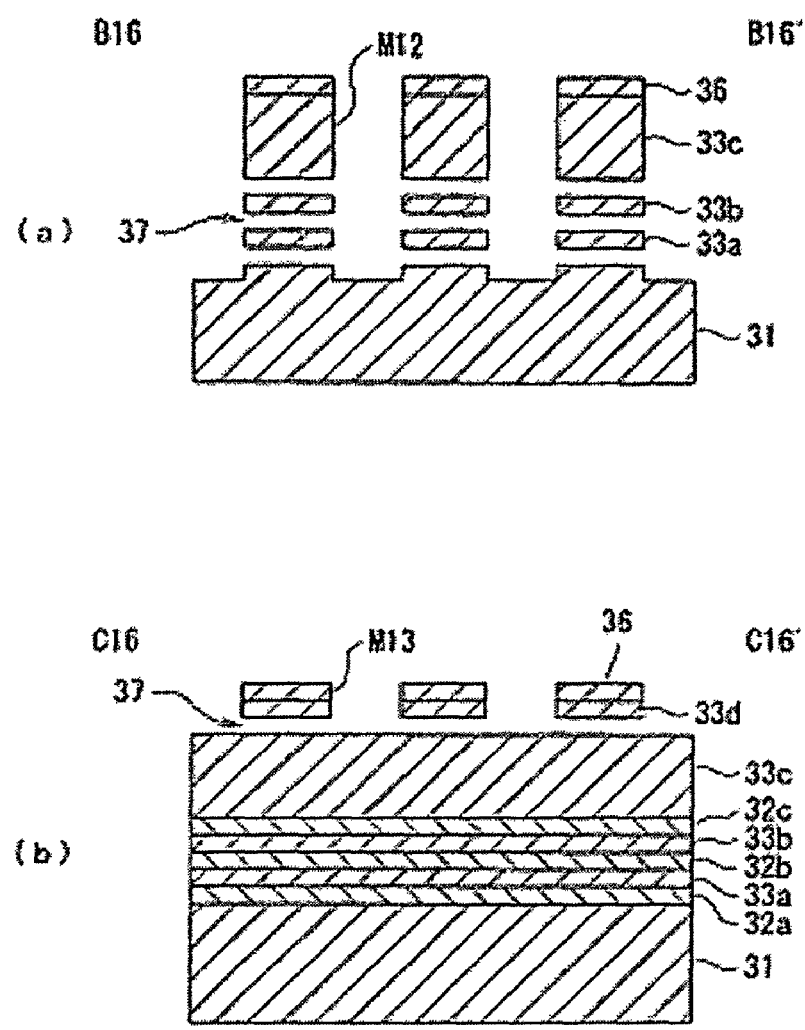
FIGS. 20(a)-20(b) are cross-sectional views showing the method for manufacturing the semiconductor device in accordance with the second embodiment.
Figure 21:
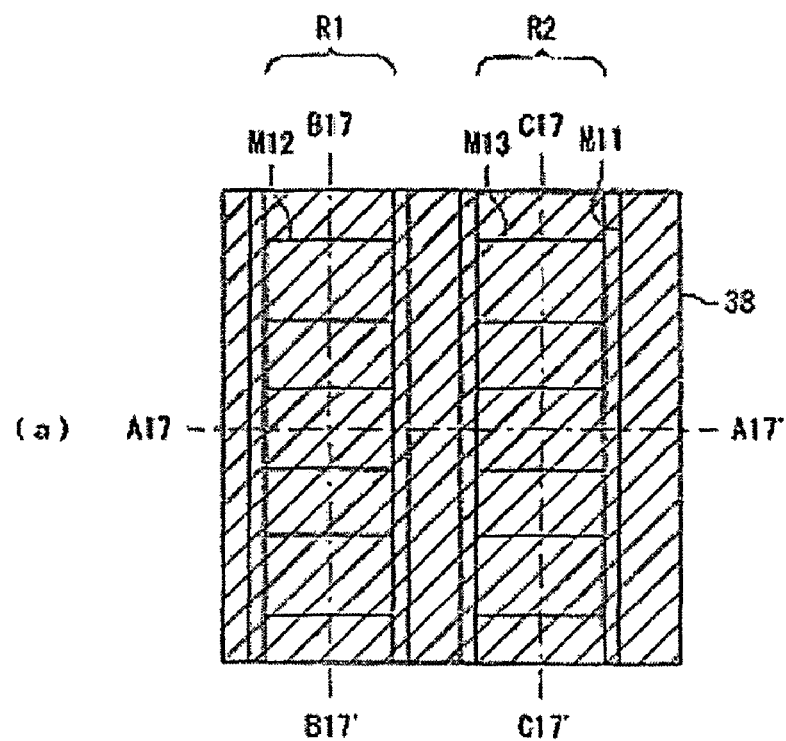
FIGS. 21(a)-21(b) are a plan view and a cross-sectional view showing the method for manufacturing the semiconductor device in accordance with the second embodiment.
Figure 21:
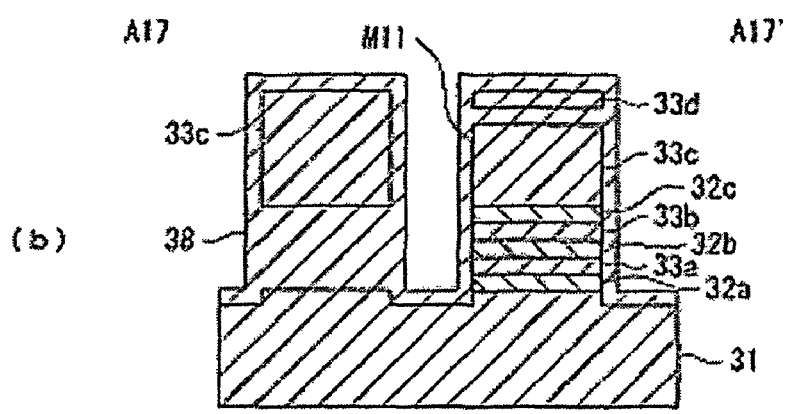
Figure 22:
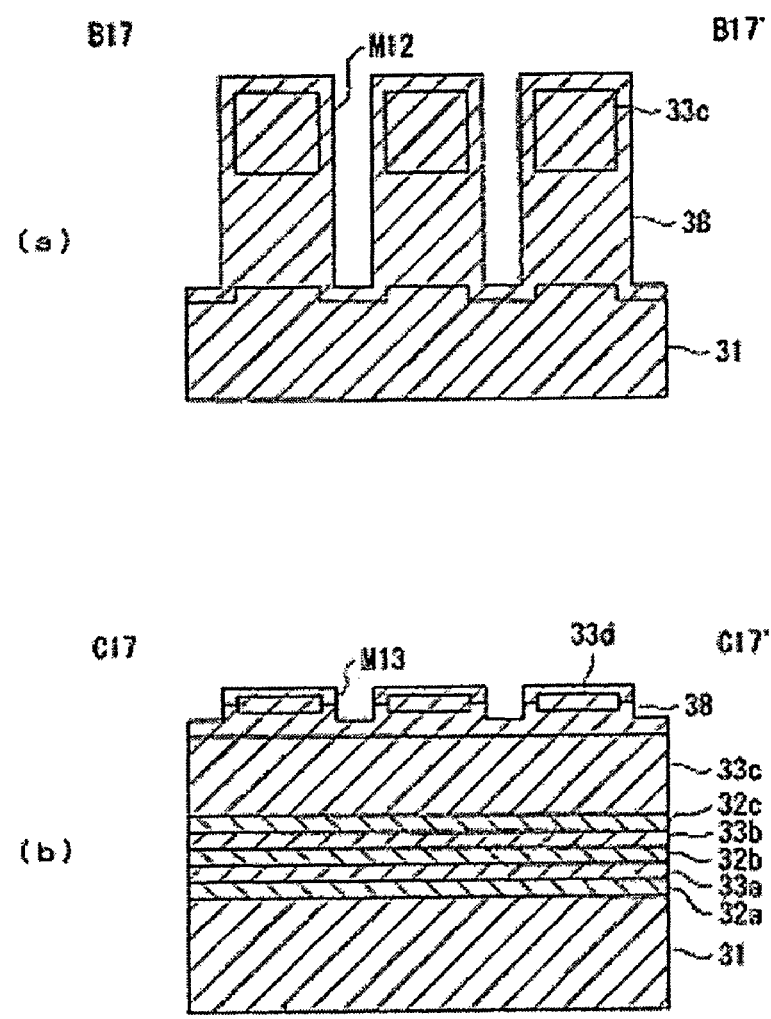
FIGS. 22(a)-22(b) are cross-sectional views showing the method for manufacturing the semiconductor device in accordance with the second embodiment.

FIG. 9-FIG. 22 are plan views and cross-sectional views showing a method for manufacturing a semiconductor device in accordance with a second embodiment of the present invention.

Referring to FIGS. 9(a)-9(b) and FIGS. 10(a)-10(b), first single crystal semiconductor layers 32a-32c and second single crystal semiconductor layers 33a-33c are alternately laminated on a semiconductor substrate 31. It is noted here that the first single crystal semiconductor layers 32a-32c can use materials having a selection ratio at etching greater than that of the semiconductor substrate 31 and the second single crystal semiconductor layers 33a-33c. In particular, when the semiconductor substrate 31 consists of Si, SiGe may preferably be used as the first single crystal semiconductor layers 32a-32c, and Si for the second single crystal semiconductor layers 33a-33c.

It is noted that a thick film semiconductor region R1 and a thin film semiconductor region R2 can be provided in the semiconductor substrate 31. Then, a partially depleted type field effect transistor may be formed in the thick film semiconductor region R1, and a completely depleted type field effect transistor can be formed in the thin film semiconductor region R2.

Then, the second single crystal semiconductor layer 33c is thermally oxidized to thereby form a sacrificial oxide film 34 on a surface of the second single crystal semiconductor layer 33c. Then, an oxidation prevention film 35 is formed on the entire surface of the sacrificial oxide film 34 by a CVD method of the like. It is noted that, for example, a silicon nitride film can be used as the oxidation prevention film 35. Then, by using a photolithography technique and an etching technique, the sacrificial oxide film 34 and the oxidation prevention film 35 are patterned, to thereby remove the sacrificial oxide film 34 and the oxidation prevention film 35 in the thin film semiconductor region R2, and expose the second single crystal semiconductor layer 33c in the thin film semiconductor region R2. Further, by using the sacrificial oxide film 34 and the oxidation prevention film 35 as a mask, the second single crystal semiconductor layer 33c is half-etched to form a step difference D in the second single crystal semiconductor layer 33c, such that the second single crystal semiconductor layer 33c in the thick film semiconductor region R1 becomes higher by the step difference D than the height of the second single crystal semiconductor layer 33c in the thin film semiconductor region R2.

Then, by using the sacrificial oxide film 34 and the oxidation prevention film 35 as a mask, epitaxial growth is conducted, whereby a first single crystal semiconductor layer 32d and a second single crystal semiconductor layer 33d are selectively formed on the second single crystal semiconductor layer 33c in the thin film semiconductor region R2. It is noted here that the first single crystal semiconductor layer 32d can use a material having a selection ratio at etching greater than that of the second single crystal semiconductor layer 33d. In particular, when the semiconductor substrate 31 consists of Si, SiGe may preferably be used as the first single crystal semiconductor layer 32d, and Si for the second single crystal semiconductor layer 33d.

Next, as shown in FIGS. 11(a)-11(b) and FIGS. 12(a)-12(b), the sacrificial oxide film 34 and the oxidation prevention film 35 in the thick film semiconductor region R1 are removed. Then by using a photolithography technique and an etching technique, the first single crystal semiconductor layers 32a-32d and the second single crystal semiconductor layers 33a-33d are patterned, thereby forming grooves M11 that expose the semiconductor substrate 31 along a predetermined direction.

It is noted that, when the semiconductor substrate 31 is exposed, etching may be stopped at the surface of the semiconductor substrate 31, or recessed sections may be formed in the semiconductor substrate 31 by over-etching the semiconductor substrate 31. Also, arrangement positions of the grooves M11 may be made to correspond to a part of element isolation regions that isolate the thick film semiconductor region R1 and the thin film semiconductor region R2 from each other.

Next, as shown in FIGS. 13(a)-13(b) and FIGS. 14(a)-14(b), a supporting body 36, that is formed in a film on side walls of the first single crystal semiconductor layers 32a-32d and the second single crystal semiconductor layers 33a-33d, and supports the second single crystal semiconductor layers 33a-33d on the semiconductor substrate 31, is formed in the grooves M1. It is noted that, when forming the supporting body 16 in a film on the side walls of the first single crystal semiconductor layers 32a-32d and the second single crystal semiconductor layers 33a-33d, epitaxial growth of semiconductor can be used. It is noted that, for example, Si, Ge, SiGe, SiC, SiSn, PbS, GaAs, InP, GaP, GaN, ZnSe or the like can be used as a material for the supporting body 36. In particular, when the semiconductor substrate 31 and the second single crystal semiconductor layers 33a-33d consist of Si, and the first single crystal semiconductor layers 32a-32d consist of SiGe, Si may preferably be used as a material of the supporting body 36.

Next, as shown in FIGS. 15(a)-15(b) and FIGS. 16(a)-16(b), by using a photolithography technique and an etching technique, the first single crystal semiconductor layers 32a-32c, the second single crystal semiconductor layers 33a-33c and the supporting body 36 are patterned, thereby forming grooves M12 that expose the semiconductor substrate 31 along a direction orthogonal to the grooves M11 in the thick film semiconductor region R1. It is noted that, when the semiconductor substrate 31 is exposed, etching may be stopped at the surface of the semiconductor substrate 31, or recessed portions may be formed in the semiconductor substrate 31 by over-etching the semiconductor substrate 31. Also, arrangement positions of the grooves M12 may be made to correspond to element isolation regions of the single crystal semiconductor layer 33c.

Next, as shown in FIGS. 17(a)-17(b) and FIGS. 18(a)-18(b), by using a photolithography technique and an etching technique, the first single crystal semiconductor layer 32d, the second single crystal semiconductor layer 33d and the supporting body 36 are patterned, thereby forming grooves M13 that expose the second single crystal semiconductor layer 33c along a direction orthogonal to the grooves M11 in the thin film semiconductor region R2. It is noted that, when the second single crystal semiconductor layer 33c is exposed, etching may be stopped at the surface of the second single crystal semiconductor layer 33c, or recessed portions may be formed in the second single crystal semiconductor layer 33c by over-etching the second single crystal semiconductor layer 33c. Also, arrangement positions of the grooves M13 may be made to correspond to element isolation regions of the single crystal semiconductor layer 33c.

Also, instead of exposing the surface of the second single crystal semiconductor layer 33c, etching may be stopped at the surface of the first single crystal semiconductor layer 32d; or the first single crystal semiconductor layer 32d may be over-etched and etching may be conducted halfway through the first single crystal semiconductor layer 32d. It is noted that, by stopping the etching of the first single crystal semiconductor layer 32d halfway through, the surface of the second single crystal semiconductor layer 32d in the grooves M13 can be prevented from being exposed. For this reason, when the first single crystal semiconductor layer 32d is removed by etching, the time during which the second single crystal semiconductor layer 33c within the grooves M3 is exposed to etching liquid or etching gas can be reduced, such that over-etching of the second single crystal semiconductor layer 33c within the grooves M3 can be suppressed.

Next, as shown in FIGS. 19(a)-19(b) and FIGS. 20(a)-20(b), etching gas or etching liquid is brought in contact with the first single crystal semiconductor layers 32a-32c through the grooves M12, and etching gas or etching liquid is brought in contact with the first single crystal semiconductor layer 32d through the grooves M13, whereby the first single crystal semiconductor layers 32a-32c in the thick film semiconductor region RI are removed by etching, and the first single crystal semiconductor layer 32d in the thin film semiconductor region R2 is removed by etching.

Further, in the thick film semiconductor region R1, void sections 37 are formed between the semiconductor substrate 31 and the second single crystal semiconductor layer 33a, and between the second single crystal semiconductor layers 33a and 33b, and 33b and 33c; and in the thin film semiconductor region R2, void sections 37 are formed between the second single crystal semiconductor layers 33c and 33d.

It is noted here that, in the thin film semiconductor region R2, the depth of the grooves M13 may be set such that the second single crystal semiconductor layer 33c remains on the first single crystal semiconductor layer 32c, whereby the first single crystal semiconductor layers 32a-32c in the thick film semiconductor region R1 can be removed, while leaving the first single crystal semiconductor layers 32a-32c remained in the thin film semiconductor region R2. For this reason, in the thick film semiconductor region R1, the second single crystal semiconductor layers 33a and 33b among the first single crystal semiconductor layers 32a through 32c can be thermally oxidized; and in the thin film semiconductor region R2, the second single crystal semiconductor layers 33a and 33b among the first single crystal semiconductor layers 32a through 32c can be prevented from being oxidized, and the second single crystal semiconductor layer 33d disposed in a layer above the second single crystal semiconductor layer 33b can be thermally oxidized. As a result, the height of a dielectric layer 38 that is formed by thermal oxidation of the second single crystal semiconductor layers 33a-33d can be made different in the thick film semiconductor region R1 and the thin film semiconductor region R2, and the number of layers of the second single crystal semiconductor layers 33a-33d that are thermally oxidized can be made different in the thick film semiconductor region R1 and the thin film semiconductor region R2. Accordingly, in the thick film semiconductor region R1 and the thin film semiconductor region R2, the film thickness of the second single crystal semiconductor layers 33c and 33d at the uppermost layer can be made different, and the film thickness of the dielectric layer 38 disposed immediately below the second single crystal semiconductor layers 33c and 33d at the uppermost layer can be made different.

Next, as shown in FIGS. 21(a)-21(b) and FIGS. 22(a)-22(b), the semiconductor substrate 31, the second single crystal semiconductor layers 33a-33d and the supporting body 36 are thermally oxidized until the second single crystal semiconductor layers 33a and 33b in the thick film semiconductor region R1 disappear, thereby forming dielectric layers 38 under the second single crystal semiconductor layer 33c in the thick film semiconductor region R1 and under the second single crystal semiconductor layer 33d in the thin film semiconductor region R2. It is noted here that, by completely thermally oxidizing the second single crystal semiconductor layers 33a and 33b in the thick film semiconductor region R1, the film thickness of the dielectric layer 38 below the second single crystal semiconductor layer 33c in the thick film semiconductor region R1 can be increased. For example, by setting the film thickness of each of the second single crystal semiconductor layers 33a and 33b to be at 45 nm, and by conducting an oxidation process such that the second single crystal semiconductor layers 33a and 33b become to be 50 nm on one side, the second single crystal semiconductor layers 33a and 33b can be completely thermally oxidized, and an oxide film of 100 nm thick can be formed with the second single crystal semiconductor layers 33a and 33b on both sides. For this reason, deterioration of the crystallinity and purity of the second single crystal semiconductor layer 33c can be suppressed, the breakdown strength and back-channel threshold breakdown strength of the dielectric layer 38 in the thick film semiconductor region R1 can be secured, and higher breakdown voltages of field effect transistors to be formed in the thick film semiconductor region R1 can be achieved.

Further, the film thickness and the number of layers of the first single crystal semiconductor layers 32a-32c and the second single crystal semiconductor layers 33a and 33b can be set such that increases in the film thickness of the second single crystal semiconductor layers 33a and 33b are absorbed by the void sections 37, when the second single crystal semiconductor layers 33a and 33b are completely thermally oxidized. By this, deterioration of the crystallinity of the second single crystal semiconductor layer 33c on the dielectric layer 38 can be suppressed, and the heights of the surfaces of the second single crystal semiconductor layer 33c in the thick film semiconductor region R1 and the second single crystal semiconductor layer 33d in the thin film semiconductor region R2 can be matched with each other, and the flatness in the surface between the second single crystal semiconductor layer 33c in the thick film semiconductor region R1 and the second single crystal semiconductor layer 33d in the thin film semiconductor region R2 can be improved.

For example, let us assume that film thicknesses $T_{A1}$-$T_{A4}$ of the first single crystal semiconductor layers 32a-32d are set to the same value of 55 nm, film thicknesses $T_{B1}$ and $T_{B2}$ of the second single crystal semiconductor layers 33a and 33b are set to the same value of 45 nm, and an oxidation processing is conducted such that the film thickness of an oxide film on one side of the second single crystal semiconductor layers 33a and 33b becomes to be 50 nm. In this case, in the thick film semiconductor region R1, the film thickness of the dielectric layer 38 under the second single crystal semiconductor layer 33c in the thick film semiconductor region R1 can be made to 300 nm, and the film thickness of the dielectric layer 38 under the second single crystal semiconductor layer 33d in the thin film semiconductor region R2 can be made to 100 nm.

Also, by setting the film thickness $T_{B3}$ of the second single crystal semiconductor layer 33c at 345 nm, and the film thickness $T_{B4}$ of the second single crystal semiconductor layer 33d at 75 nm, the film thickness of the second single crystal semiconductor layer 33c on the dielectric layer 38 can be set to 300 nm in the thick film semiconductor region R1, and the film thickness of the second single crystal semiconductor layer 33d on the dielectric layer 38 can be set to 30 nm in the thin film semiconductor region R2.

In this manner, by appropriately adjusting the film thickness and the number of layers of the first single crystal semiconductor layers 32a-32d and the second single crystal semiconductor layers 33a-33d, the flatness of their surface can be secured, and various combinations of semiconductor layers and BOX layers in various film thicknesses can be realized.

It is noted here that, in the thin film semiconductor region R2, by disposing the second single crystal semiconductor layer 33d on the dielectric layer 38, when the effective channel length of a high-speed/lower power semiconductor element is 0.1 μm or less, the film thickness of the second single crystal semiconductor layer 33d can be made to 50 nm or less, whereby a completely depleted type SOI transistor in which the short-channel effect is suppressed can be formed.

Also, in the thick film semiconductor region R1, by disposing the second single crystal semiconductor layer 33c on the dielectric layer 38, the film thickness of the second single crystal semiconductor layer 33c on the dielectric layer 38 can be increased. For this reason, a partially depleted type SOI transistor can be formed, while a high junction breakdown strength and a large current capacity can be secured.

Figure 23:
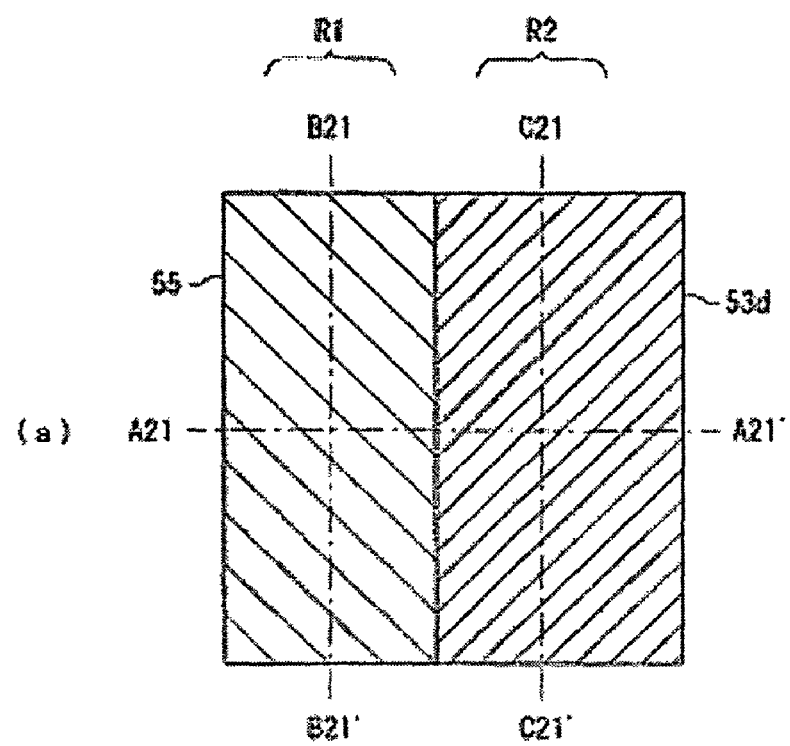
FIGS. 23(a)-23(b) are a plan view and a cross-sectional view showing a method for manufacturing a semiconductor device in accordance with a third embodiment.
Figure 23:
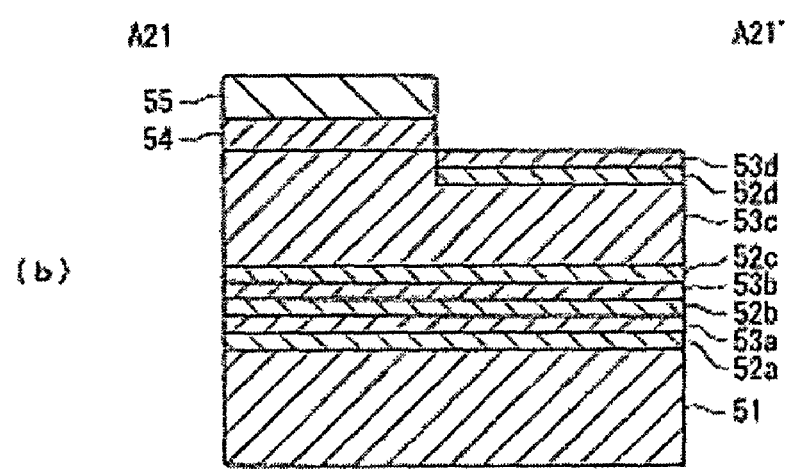
Figure 24:
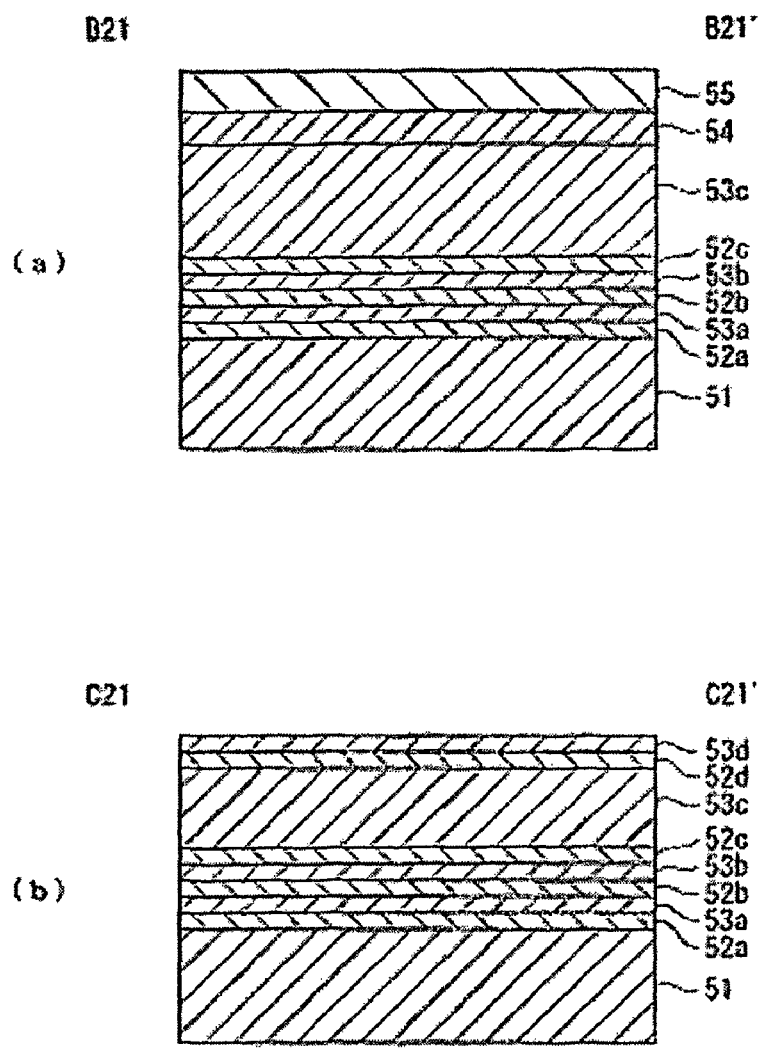
FIGS. 24(a)-24(b) are cross-sectional views showing the method for manufacturing the semiconductor device in accordance with the third embodiment.
Figure 25:
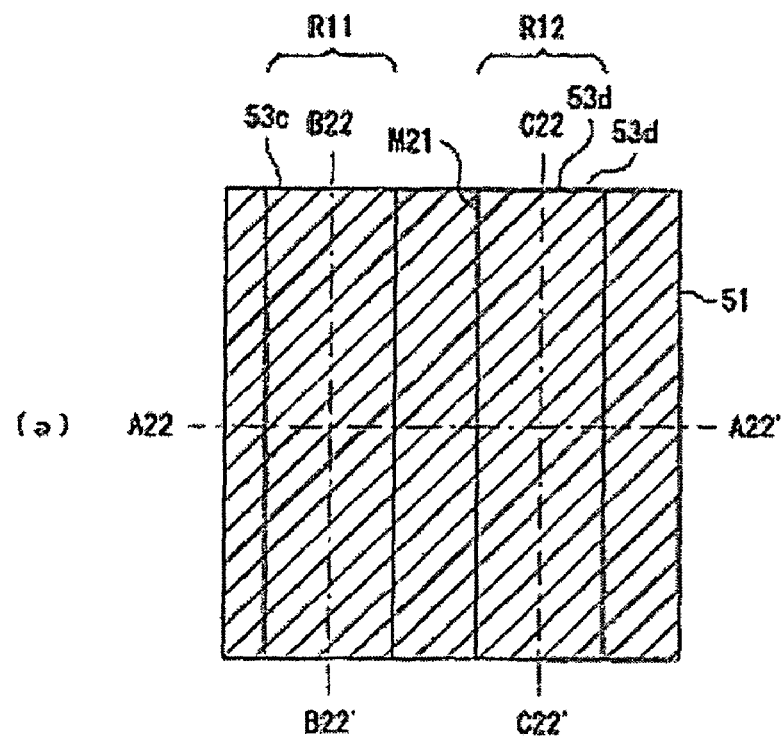
FIGS. 25(a)-25(b) are a plan view and a cross-sectional view showing the method for manufacturing the semiconductor device in accordance with the third embodiment.
Figure 25:
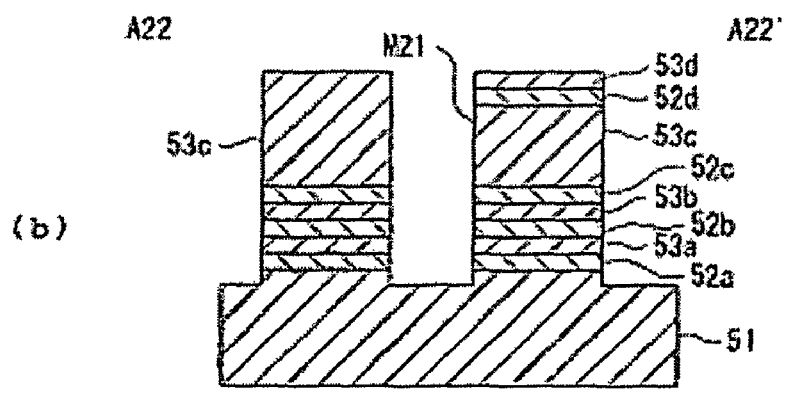
Figure 26:
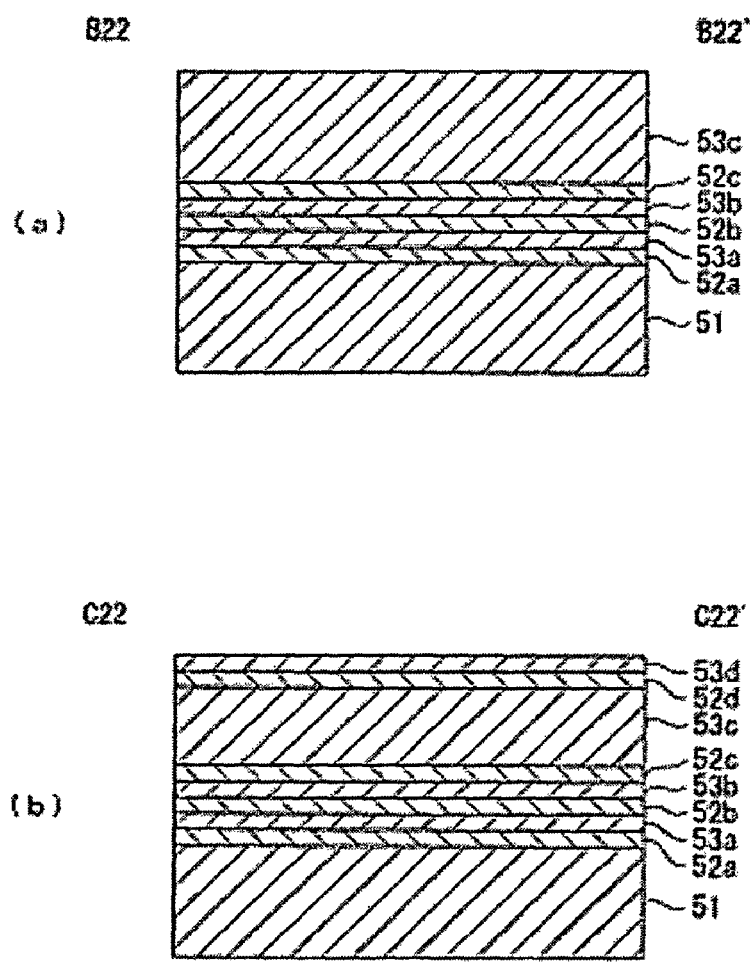
FIGS. 26(a)-26(b) are cross-sectional views showing the method for manufacturing the semiconductor device in accordance with the third embodiment.
Figure 27:
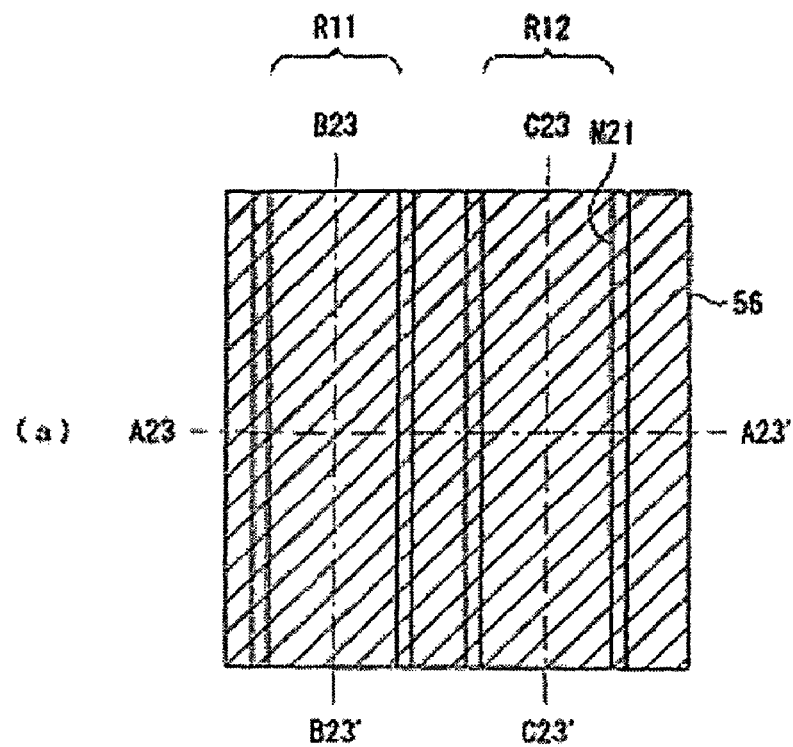
FIGS. 27(a)-27(b) are a plan view and a cross-sectional view showing the method for manufacturing the semiconductor device in accordance with the third embodiment.
Figure 27:
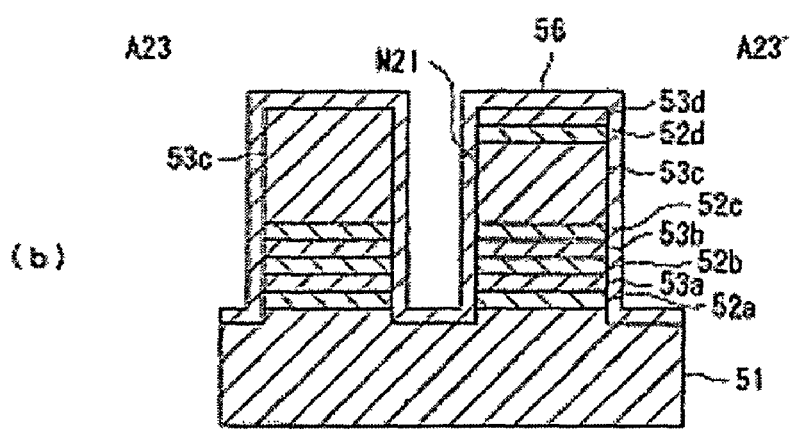
Figure 28:
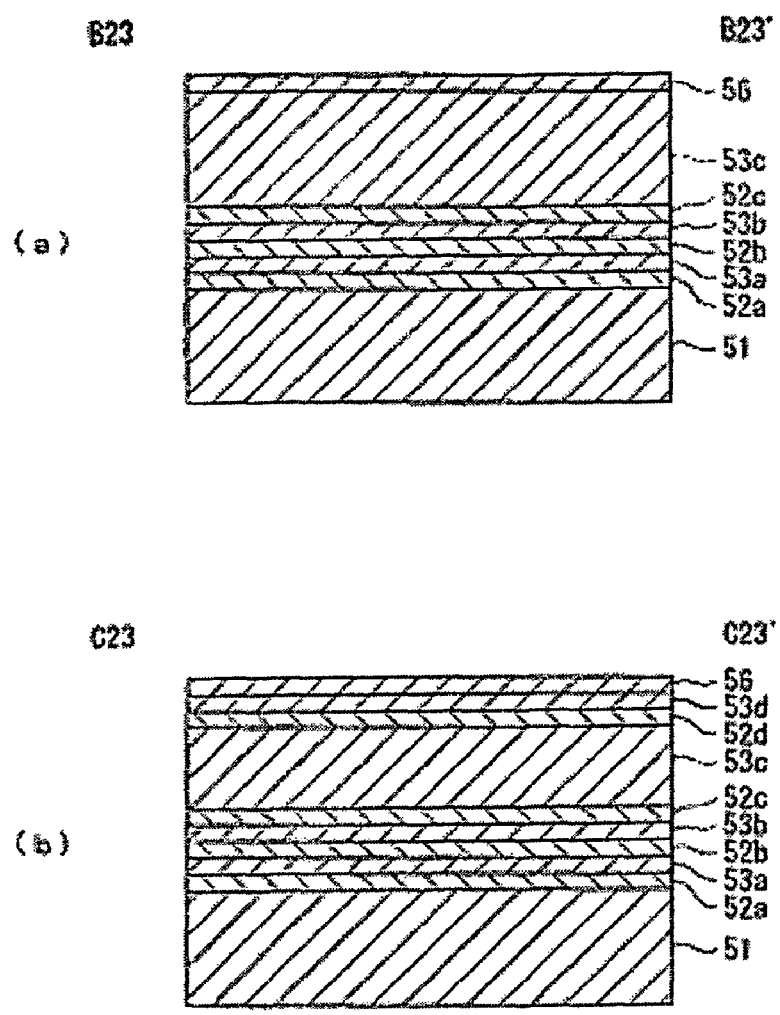
FIGS. 28(a)-28(b) are cross-sectional views showing the method for manufacturing the semiconductor device in accordance with the third embodiment.
Figure 29:
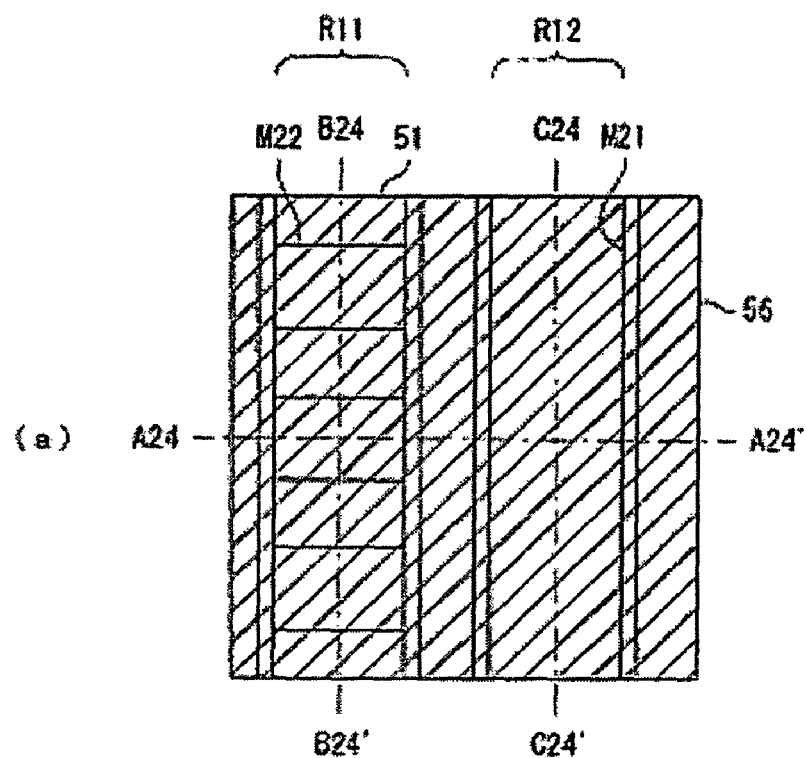
FIGS. 29(a)-29(b) are a plan view and a cross-sectional view showing the method for manufacturing the semiconductor device in accordance with the third embodiment.
Figure 29:
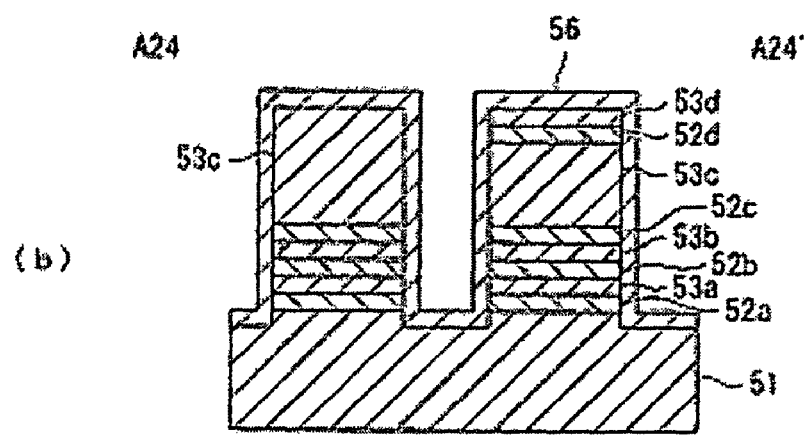
Figure 30:
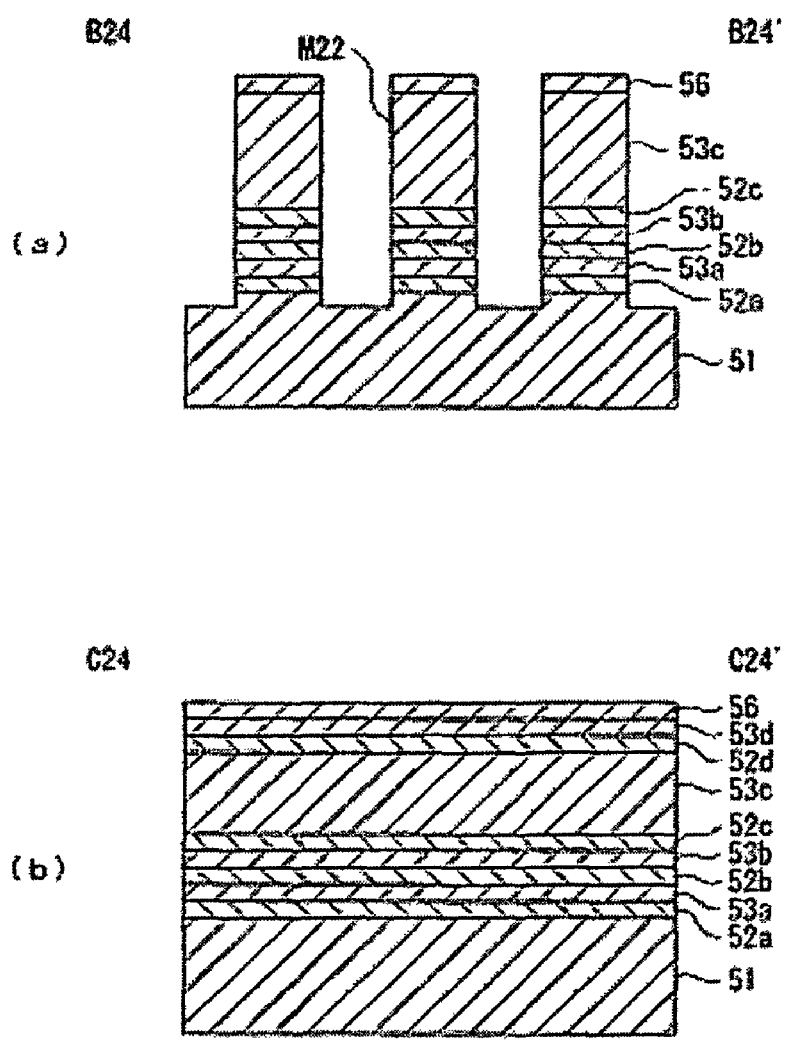
FIGS. 30(a)-30(b) are cross-sectional views showing the method for manufacturing the semiconductor device in accordance with the third embodiment.
Figure 31:
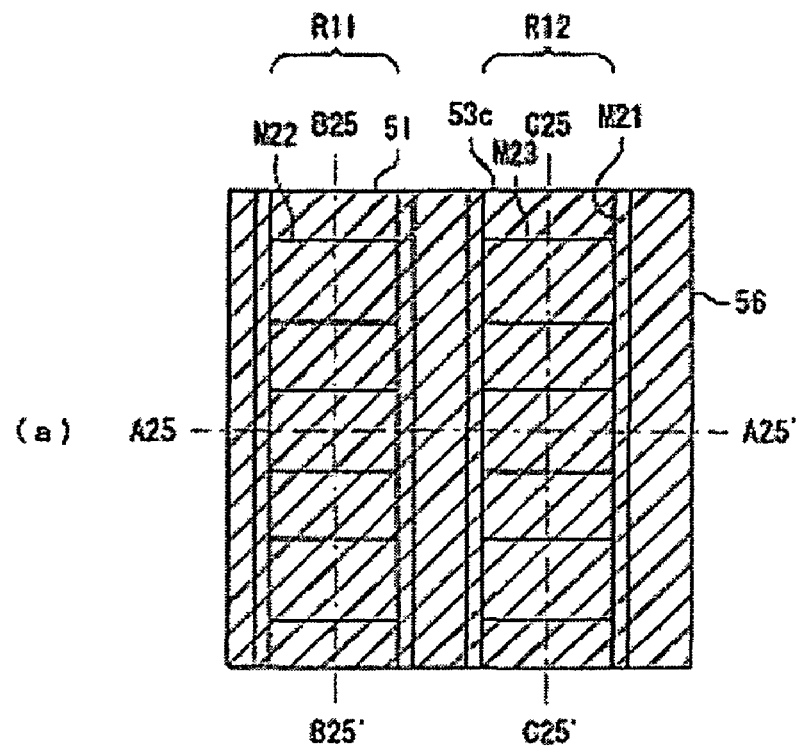
FIGS. 31(a)-31(b) are a plan view and a cross-sectional view showing the method for manufacturing the semiconductor device in accordance with the third embodiment.
Figure 31:
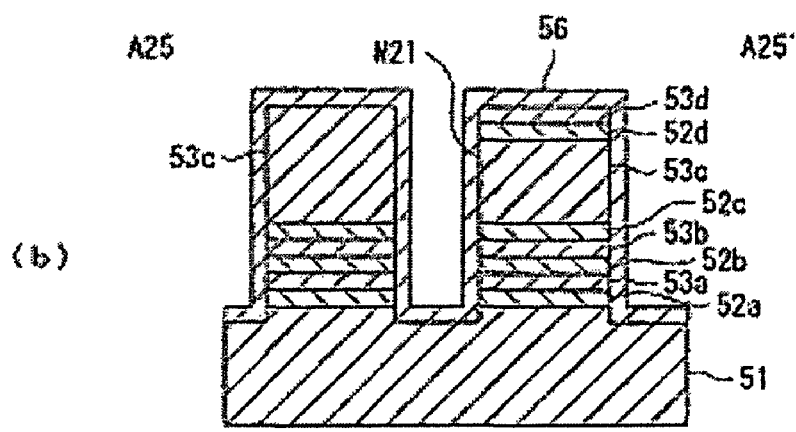
Figure 32:
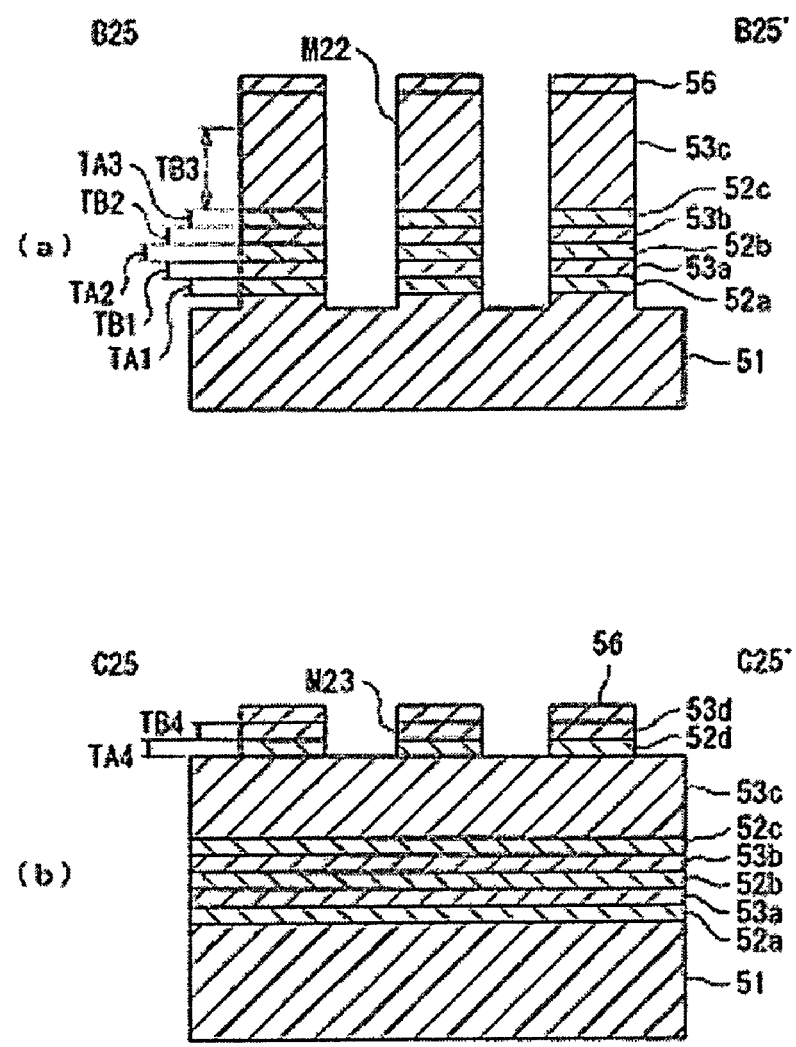
FIGS. 32(a)-32(b) are cross-sectional views showing the method for manufacturing the semiconductor device in accordance with the third embodiment.
Figure 33:
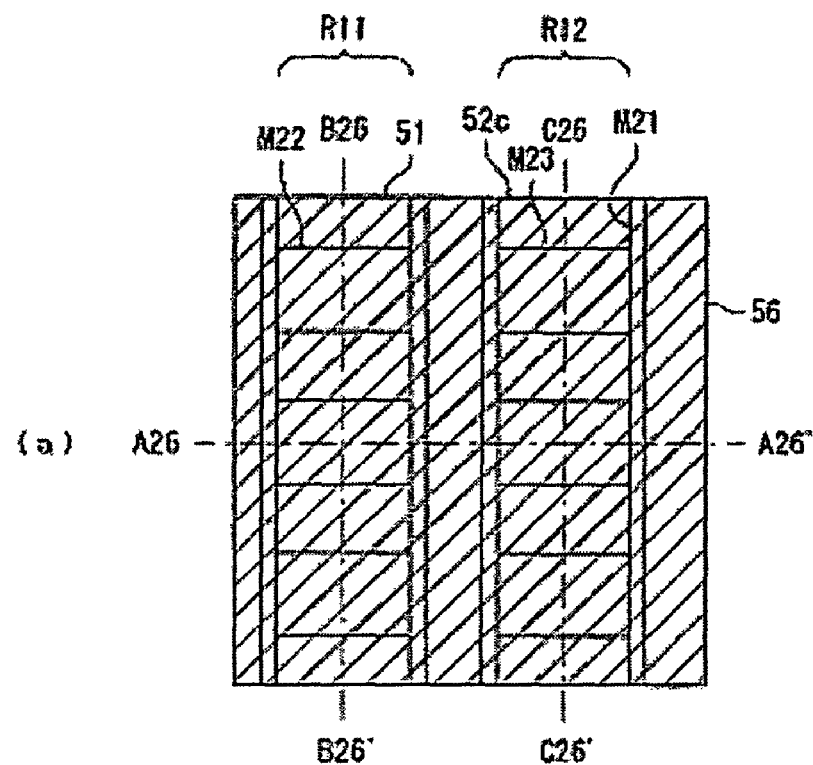
FIGS. 33(a)-33(b) are a plan view and a cross-sectional view showing the method for manufacturing the semiconductor device in accordance with the third embodiment.
Figure 33:
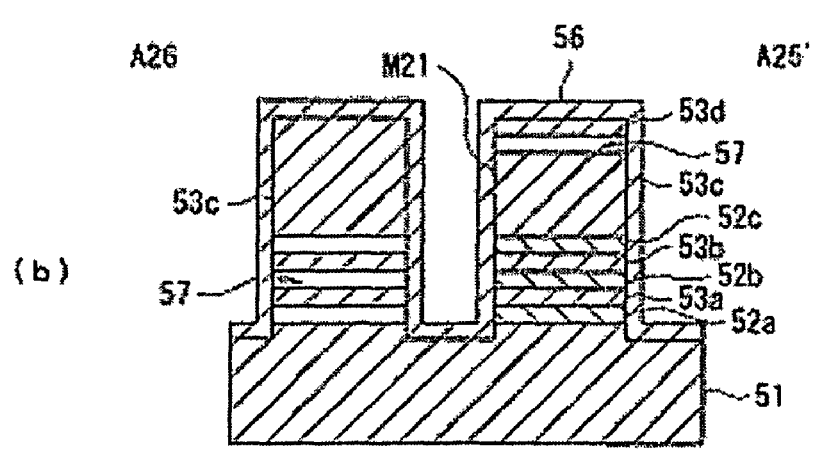
Figure 34:
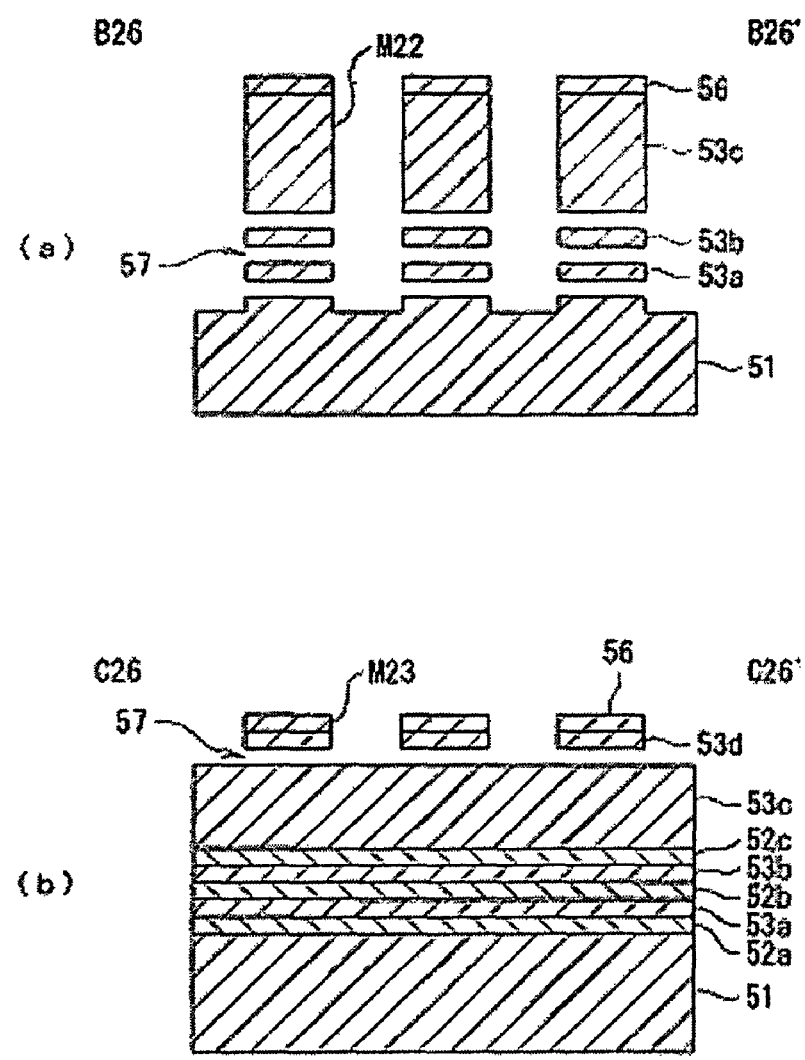
FIGS. 34(a)-34(b) are cross-sectional views showing the method for manufacturing the semiconductor device in accordance with the third embodiment.
Figure 35:
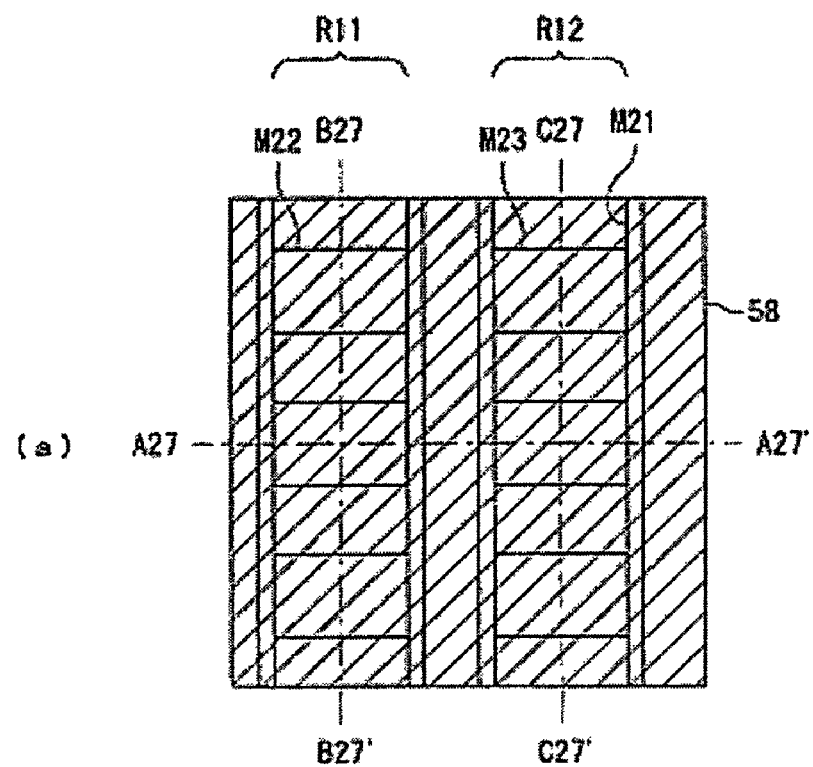
FIGS. 35(a)-35(b) are a plan view and a cross-sectional view showing the method for manufacturing the semiconductor device in accordance with the third embodiment.
Figure 35:
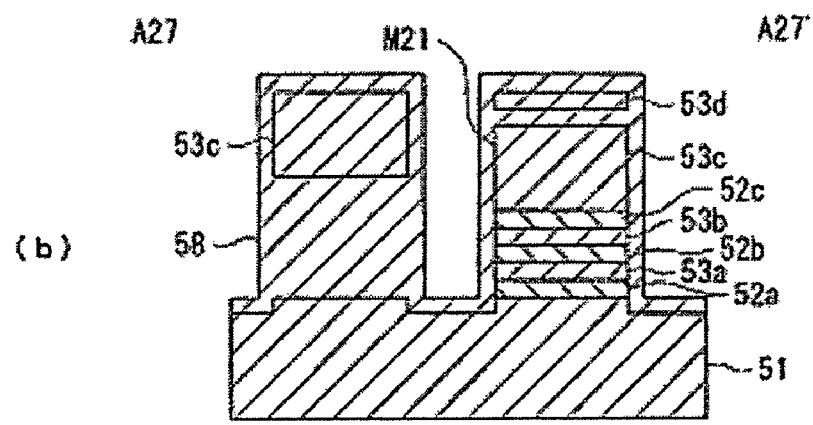
Figure 36:
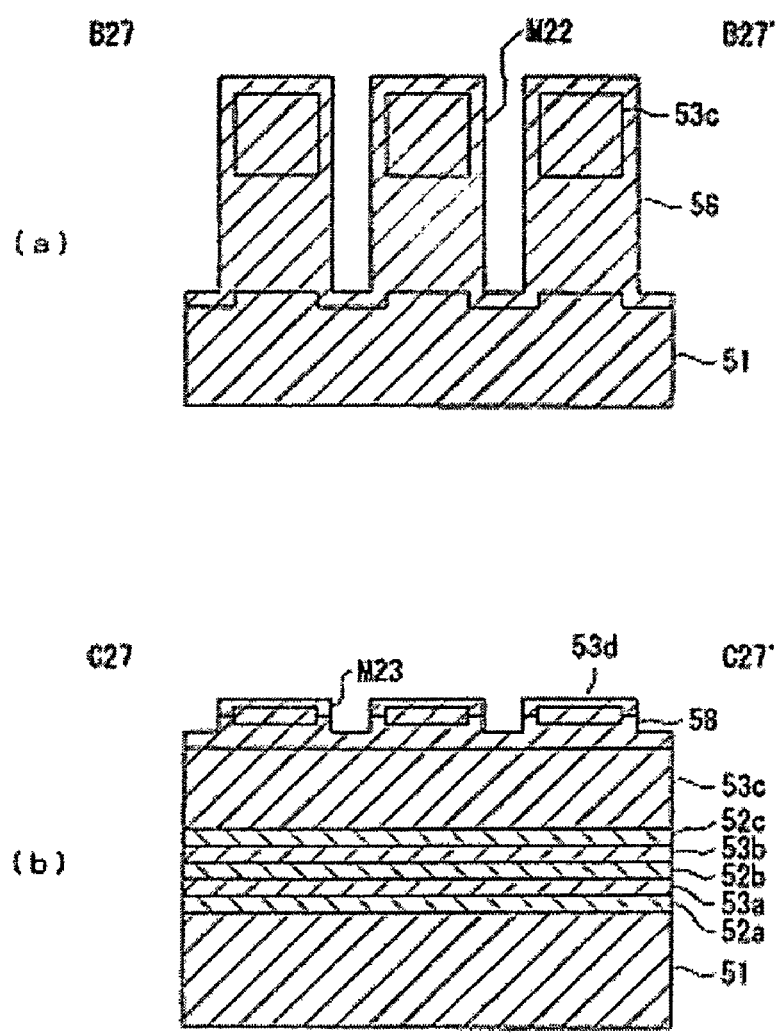
FIGS. 36(a)-36(b) are cross-sectional views showing the method for manufacturing the semiconductor device in accordance with the third embodiment.
Figure 37:
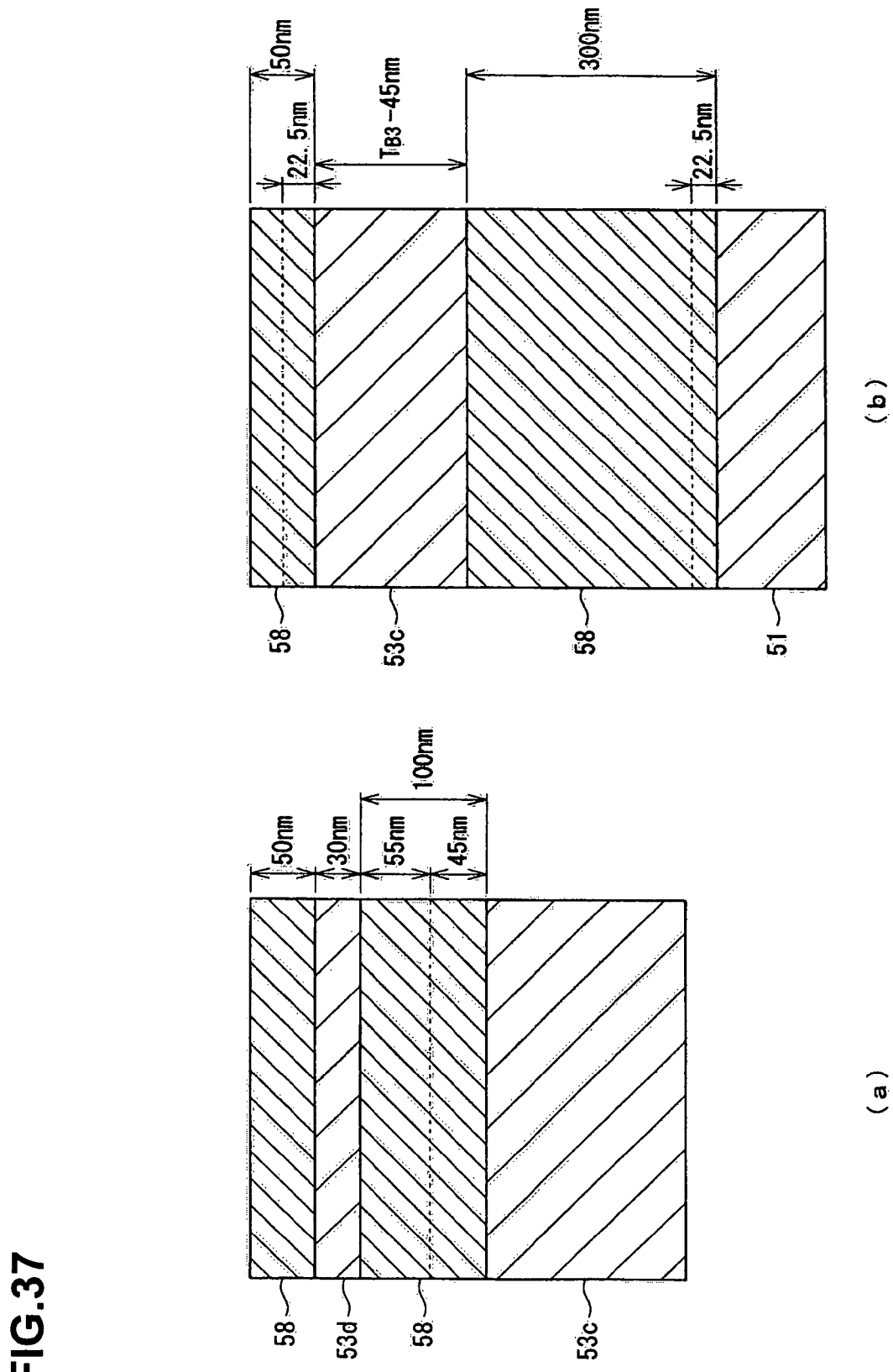
FIGS. 37(a)-37(b) are cross-sectional views showing the method for manufacturing the semiconductor device in accordance with the third embodiment.

FIGS. 23-FIG. 37 are plan views and cross-sectional views showing a method for manufacturing a semiconductor device in accordance with a third embodiment of the present invention.

Referring to FIGS. 23(a)-23(b) and FIGS. 24(a)-24(b), first single crystal semiconductor layers 52a-52c and second single crystal semiconductor layers 53a-53c are alternately laminated on a semiconductor substrate 51. It is noted here that the first single crystal semiconductor layers 52a-52c can use materials having a selection ratio at etching greater than that of the semiconductor substrate 51 and the second single crystal semiconductor layers 53a-53c. In particular, when the semiconductor substrate 51 consists of Si, SiGe may preferably be used as the first single crystal semiconductor layers 52a-52c, and Si for the second single crystal semiconductor layers 53a-53c.

It is noted that a thick film semiconductor region R11 and a thin film semiconductor region R12 can be provided in the semiconductor substrate 51. Then, a partially depleted type field effect transistor may be formed in the thick film semiconductor region R11, and a completely depleted type field effect transistor can be formed in the thin film semiconductor region R12.

Then, the second single crystal semiconductor layer 53c is thermally oxidized to thereby form a sacrificial oxide film 54 on a surface of the second single crystal semiconductor layer 53c. Then, an oxidation prevention film 55 is formed on the entire surface of the sacrificial oxide film 54 by a CVD method of the like. Then, by using a photolithography technique and an etching technique, the sacrificial oxide film 54 and the oxidation prevention film 55 are patterned, to thereby remove the sacrificial oxide film 54 and the oxidation prevention film 55 in the thin film semiconductor region R12, and expose the second single crystal semiconductor layer 53c in the thin film semiconductor region R12.

Then, by using the sacrificial oxide film 54 and the oxidation prevention film 55 as a mask, epitaxial growth is conducted, whereby a first single crystal semiconductor layer 52d and a second single crystal semiconductor layer 53d are selectively formed on the second single crystal semiconductor layer 53c in the thin film semiconductor region R12. It is noted here that the first single crystal semiconductor layer 52d can use a material having a selection ratio at etching greater than that of the second single crystal semiconductor layer 53d. In particular, when the semiconductor substrate 51 consists of Si, SiGe may preferably be used as the first single crystal semiconductor layer 52d, and Si for the second single crystal semiconductor layer 53d.

Next, as shown in FIGS. 25(a)-25(b) and FIGS. 26(a)-26(b), the sacrificial oxide film 54 and the oxidation prevention film 55 in the thick film semiconductor region R11 are removed. Then by using a photolithography technique and an etching technique, the first single crystal semiconductor layers 52a-52d and the second single crystal semiconductor layers 53a-53d are patterned, thereby forming grooves M21 that expose the semiconductor substrate 51 along a predetermined direction.

Next, as shown in FIGS. 27(a)-27(b) and FIGS. 28(a)-28(b), a supporting body 56, that is formed in a film on side walls of the first single crystal semiconductor layers 52a-52d and the second single crystal semiconductor layers 53a-53d, and supports the second single crystal semiconductor layers 53a-53d on the semiconductor substrate 51, is formed in the grooves M21. It is noted that, for example, Si, Ge, SiGe, SiC, SiSn, PbS, GaAs, InP, GaP, GaN, ZnSe or the like can be used as a material for the supporting body 56. In particular, when the semiconductor substrate 51 and the second single crystal semiconductor layers 53a-53d consist of Si, and the first single crystal semiconductor layers 52a-52d consist of SiGe, Si may preferably be used as a material of the supporting body 56.

Next, as shown in FIGS. 29(a)-29(b) and FIGS. 30(a)-30(b), by using a photolithography technique and an etching technique, the first single crystal semiconductor layers 52a-52c, the second single crystal semiconductor layers 53a-53c and the supporting body 56 are patterned, thereby forming grooves M22 that expose the semiconductor substrate 51 along a direction orthogonal to the grooves M21 in the thick film semiconductor region R11.

Next, as shown in FIGS. 31(a)-31(b) and FIGS. 32(a)-32(b), by using a photolithography technique and an etching technique, the first single crystal semiconductor layers 52d, the second single crystal semiconductor layer 53d and the supporting body 56 are patterned, thereby forming grooves M23 that expose the second single crystal semiconductor layer 53c along a direction orthogonal to the grooves M21 in the thin film semiconductor region R12.

Next, as shown in FIGS. 33(a)-33(b) and FIGS. 34(a)-34(b), etching gas or etching liquid is brought in contact with the first single crystal semiconductor layers 52a-52c through the grooves M22, and etching gas or etching liquid is brought in contact with the first single crystal semiconductor layer 52d through the grooves M23, whereby the first single crystal semiconductor layers 52a-52c in the thick film semiconductor region R11 are removed by etching, and the first single crystal semiconductor layer 52d in the thin film semiconductor region R12 is removed by etching. Further, in the thick film semiconductor region R11, void sections 57 are formed between the semiconductor substrate 51 and the second single crystal semiconductor layer 53a, and between the second single crystal semiconductor layers 53a and 53b, and 53b and 53c; and in the thin film semiconductor region R12, void sections 57 are formed between the second single crystal semiconductor layers 53c and 53d.

It is noted here that, in the thin film semiconductor region R12, the depth of the grooves M23 may be set such that the second single crystal semiconductor layer 53c remains on the first single crystal semiconductor layer 52c, whereby the first single crystal semiconductor layers 52a-52c in the thick film semiconductor region R11 can be removed, while leaving the first single crystal semiconductor layers 52a-52c remained in the thin film semiconductor region R12. For this reason, in the thick film semiconductor region R11, the second single crystal semiconductor layers 53a and 53b among the first single crystal semiconductor layers 52a through 52c can be thermally oxidized; and in the thin film semiconductor region R12, the second single crystal semiconductor layers 53a and 53b among the first single crystal semiconductor layers 52a through 52c can be prevented from being oxidized, and the second single crystal semiconductor layer 53d disposed in a layer above the second single crystal semiconductor layer 53b can be thermally oxidized. As a result, the height of a dielectric layer 58 that is formed by thermal oxidation of the second single crystal semiconductor layers 53a-53d can be made different in the thick film semiconductor region R11 and the thin film semiconductor region R12, and the number of layers of the second single crystal semiconductor layers 53a-53d that are thermally oxidized can be made different in the thick film semiconductor region R11 and the thin film semiconductor region R12. Accordingly, in the thick film semiconductor region R11 and the thin film semiconductor region R12, the film thickness of the second single crystal semiconductor layers 53c and 53d at the uppermost layer can be made different, and the film thickness of the dielectric layer 58 disposed immediately below the second single crystal semiconductor layers 53c and 53d at the uppermost layer can be made different.

Next, as shown in FIGS. 35(a)-35(b) and FIGS. 36(a)-36(b), the semiconductor substrate 51, the second single crystal semiconductor layers 53a-53d and the supporting body 56 are thermally oxidized until the second single crystal semiconductor layers 53a and 53b in the thick film semiconductor region R11 disappear, thereby forming dielectric layers 58 under the second single crystal semiconductor layer 53c in the thick film semiconductor region R11 and under the second single crystal semiconductor layer 53d in the thin film semiconductor region R12. It is noted here that, by completely thermally oxidizing the second single crystal semiconductor layers 53a and 53b in the thick film semiconductor region R11, the film thickness of the dielectric layer 58 below the second single crystal semiconductor layer 53c in the thick film semiconductor region R11 can be increased. For this reason, deterioration of the crystallinity and purity of the second single crystal semiconductor layer 53c can be suppressed, the breakdown strength and back-channel threshold breakdown strength of the dielectric layer 58 in the thick film semiconductor region R11 can be secured, and higher breakdown voltages of field effect transistors to be formed in the thick film semiconductor region R11 can be achieved.

Also, the film thickness and the number of layers of the first single crystal -semiconductor layers 52a-52c and the second single crystal semiconductor layers 53a and 53b can be set such that increases in the film thickness of the second single crystal semiconductor layers 53a and 53b become greater than the void sections 57, when the second single crystal semiconductor layers 53a and 53b are completely thermally oxidized. By this, by forming the dielectric layer 58 below the second single crystal semiconductor layer 53c, the second single crystal semiconductor layer 53c in the thick film semiconductor region R11 can be lifted up. For this reason, the heights of the surfaces of the second single crystal semiconductor layer 53c in the thick film semiconductor region R11 and the second single crystal semiconductor layer 53d in the thin film semiconductor region R12 can be matched with each other, and the flatness in the surface between the second single crystal semiconductor layer 53c in the thick film semiconductor region R11 and the second single crystal semiconductor layer 53d in the thin film semiconductor region R12 can be improved.

For example, by setting the film thickness $T_{A4}$ of the first single crystal semiconductor layer 52d to 55 nm, and the film thickness $T_{B4}$ of the second single crystal semiconductor layer 53d to 75 nm, the film thickness of the second single crystal semiconductor layer 53d on the dielectric layer 58 can be set to 30 nm, and the film thickness of the dielectric layer 58 under the second single crystal semiconductor layer 53d can be set to 100 nm, as shown in FIG. 37(a), in the thin film semiconductor region R12. It is noted here that the height of the surface of the second single crystal semiconductor layer 53d can be made higher than the surface of the semiconductor substrate 51 before thermal oxidation by $(T_{A1}+T_{B1}+T_{A2}+T_{B2}+T_{A3}+T_{B3}+85$ nm$)$.

On the other hand, in the thick film semiconductor region R11, an increase in the film thickness by thermal oxidation of the second single crystal semiconductor layers 53a-53c equals to, as shown in FIG. 37(b), the sum of an amount of an increase (55 nm) in the film thickness between an upper surface of the semiconductor substrate 51 and a lower surface of the second single crystal semiconductor layer 53a minus the film thickness of the first single crystal semiconductor layer 52a (55 nm$-T_{A1}$), an amount of an increase (55 nm) in the film thickness between an upper surface of the second single crystal semiconductor layer 53a and a lower surface of the second single crystal semiconductor layer 53b minus the film thickness of the first single crystal semiconductor layer 52b (55 nm$-T_{A2}$), an amount of an increase (55 nm) in the film thickness between an upper surface of the second single crystal semiconductor layer 53b and a lower surface of the second single crystal semiconductor layer 53c minus the film thickness of the first single crystal semiconductor layer 52c (55 nm$-T_{A3}$), and an amount of a decrease ($-22.5$ nm) in the film thickness of the semiconductor layer by surface oxidation of the second single crystal semiconductor layer 53c.

In this manner, by appropriately adjusting the film thickness and the number of layers of the first single crystal semiconductor layers 52a-52d and the second single crystal semiconductor layers 53a-53d, the flatness of their surface can be secured, and various combinations of semiconductor layers and BOX layers in various film thicknesses can be realized.

What is claimed is:

1. A semiconductor substrate characterized in comprising:
   a semiconductor base;
   a first dielectric layer formed on the semiconductor base, the first dielectric layer having a first thickness;
   a second dielectric layer formed on the semiconductor base, the second dielectric layer having a second thickness different from the first thickness;
   a first semiconductor layer formed on the first dielectric layer, the first semiconductor layer having a third thickness, the first semiconductor layer being a single crystal semiconductor layer;
   a second semiconductor layer formed on the second dielectric layer, the second semiconductor layer having a fourth thickness different from the third thickness, the second semiconductor layer being a single crystal semiconductor layer; and
   a third semiconductor layer formed between the semiconductor base and the second dielectric layer, the third semiconductor layer being a single crystal semiconductor layer.

2. The semiconductor substrate of claim 1, wherein the first semiconductor layer is formed immediately on the first dielectric layer.

3. The semiconductor substrate of claim 1, wherein the second semiconductor layer is formed immediately on the second dielectric layer.

4. The semiconductor substrate of claim 1, wherein the first dielectric layer is formed immediately on the semiconductor base.

5. A semiconductor substrate characterized in comprising:
   a semiconductor base;
   a first dielectric layer formed on the semiconductor base, the first dielectric layer having a first thickness;

a second dielectric layer formed on the semiconductor base, the second dielectric layer having a second thickness different from the first thickness;

a first semiconductor layer formed on the first dielectric layer to form a first semiconductor element having a first breakdown voltage for a first usage, the first semiconductor layer having a third thickness, and the first semiconductor layer being a single crystal semiconductor layer;

a second semiconductor layer formed on the second dielectric layer to form a second semiconductor element having a second breakdown voltage different from the first breakdown voltage for a second usage different from the first usage, the second semiconductor layer having a fourth thickness different from the third thickness, and the second semiconductor layer being a single crystal semiconductor layer; and a third semiconductor layer formed between the semiconductor base and the second dielectric layer, the third semiconductor being a single crystal semiconductor layer.

6. The semiconductor substrate of claim 5, wherein the first semiconductor layer is formed immediately on the first dielectric layer.

7. The semiconductor substrate of claim 5, wherein the second semiconductor layer is formed immediately on the second dielectric layer.

8. The semiconductor substrate of claim 5, wherein the first dielectric layer is formed immediately on the semiconductor base.

9. A semiconductor device characterized in comprising:
a semiconductor base;
a first dielectric layer formed on the semiconductor base, the first dielectric layer having a first thickness;
a second dielectric layer formed on the semiconductor base, the second dielectric layer having a second thickness different from the first thickness;
a first semiconductor layer formed on the first dielectric layer, the first semiconductor layer having a third thickness, and the first semiconductor layer being a single crystal semiconductor layer;
a second semiconductor layer formed on the second dielectric layer, the second semiconductor layer having a fourth thickness different from the third thickness, and the second semiconductor layer being a single crystal semiconductor layer; and
a third semiconductor layer formed between the semiconductor base and the second dielectric layer, the third semiconductor layer being a single crystal semiconductor layer,
wherein the first and second semiconductor layers form semiconductor elements having different breakdown voltages for mutually different usages formed on the semiconductor base and the semiconductor layers.

10. The semiconductor device of claim 9, wherein the first semiconductor layer is formed immediately on the first dielectric layer.

11. The semiconductor device of claim 9, wherein the second semiconductor layer is formed immediately on the second dielectric layer.

12. The semiconductor device of claim 9, wherein the first dielectric layer is formed immediately on the semiconductor base.

* * * * *